(12) United States Patent
Ho et al.

(10) Patent No.: US 12,400,875 B2
(45) Date of Patent: Aug. 26, 2025

(54) FILM DEPOSITION FOR PATTERNING PROCESS

(71) Applicant: Taiwan Semiconductor Manufacturing Co., Ltd., Hsinchu (TW)

(72) Inventors: Ssu-Yu Ho, Hsinchu (TW); Szu-Ping Tung, Taipei (TW); Ching-Yu Chang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 624 days.

(21) Appl. No.: 17/706,152

(22) Filed: Mar. 28, 2022

(65) Prior Publication Data

US 2023/0178379 A1 Jun. 8, 2023

Related U.S. Application Data

(60) Provisional application No. 63/286,624, filed on Dec. 7, 2021.

(51) Int. Cl.
*H01L 21/47* (2006.01)
*H01L 21/02* (2006.01)
*H01L 21/027* (2006.01)

(52) U.S. Cl.
CPC ........ *H01L 21/47* (2013.01); *H01L 21/02263* (2013.01); *H01L 21/0274* (2013.01)

(58) Field of Classification Search
CPC ............... H01L 21/47; H01L 21/02263; H01L 21/0274; H01L 21/76843; H01L 21/76849; H01L 21/02115; H01L 21/31144; H01L 21/0337; H01L 21/76816; H01L 21/0332; H01L 21/7684; H01L 21/7685; H01L 21/76877
See application file for complete search history.

(56) References Cited

U.S. PATENT DOCUMENTS

| | | | |
|---|---|---|---|
| 2015/0155171 A1* | 6/2015 | Chang | H01L 21/32139 438/703 |
| 2017/0025284 A1* | 1/2017 | Kang | H01L 21/0337 |
| 2018/0315601 A1 | 11/2018 | Peng et al. | |

FOREIGN PATENT DOCUMENTS

| | | |
|---|---|---|
| DE | 102017128235 A1 | 10/2018 |
| KR | 20140077865 A | 6/2014 |
| KR | 20180121327 A | 11/2018 |

\* cited by examiner

*Primary Examiner* — Su C Kim
(74) *Attorney, Agent, or Firm* — Slater Matsil, LLP

(57) ABSTRACT

Embodiments utilize a photoetching process in forming a patterned target layer. After forming a patterned mandrel layer and spacer layer over the patterned mandrel layer, a bottom layer of a photomask is deposited using a chemical vapor deposition process to form an amorphous carbon film. An upper layer of the photomask is used to pattern the bottom layer to form openings for a reverse material. The reverse material is deposited in the openings of the bottom layer, the bottom layer providing both a mask and template function for the reverse material.

20 Claims, 27 Drawing Sheets

100

100

FILM DEPOSITION FOR PATTERNING PROCESS

PRIORITY CLAIM AND CROSS-REFERENCE

This application claims the benefit of the following provisionally filed U.S. Patent application: Application Ser. No. 63/286,624, filed Dec. 7, 2021, and entitled "BEOL Chemical Vapor Deposition Thin Film with High Gap-fill Capability," which application is hereby incorporated herein by reference.

BACKGROUND

In order to form integrated circuits on wafers, a lithography process is used. A typical lithography process involves applying a photo resist, and defining patterns on the photo resist. The patterns in the patterned photo resist are defined in a lithography mask, and are defined either by the transparent portions or by the opaque portions in the lithography mask. The patterns in the patterned photo resist are then transferred to the underlying features through an etching step, wherein the patterned photo resist is used as an etching mask. After the etching step, the patterned photo resist is removed.

With the increasing down-scaling of integrated circuits, high aspect ratio stacking of layers used in photo patterning techniques can lead to poor wiggling resistance during pattern transfer to an amorphous silicon substrate. Line wiggling can, in turn, lead to pattern defects. Pattern defects and line wiggling can result in in breaking metal pattern lines and cause the pattern to fail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B through 27A and 27B illustrate cross-sectional and top down views in intermediate stages of forming a semiconductor device.

DETAILED DESCRIPTION

Figure 1B:
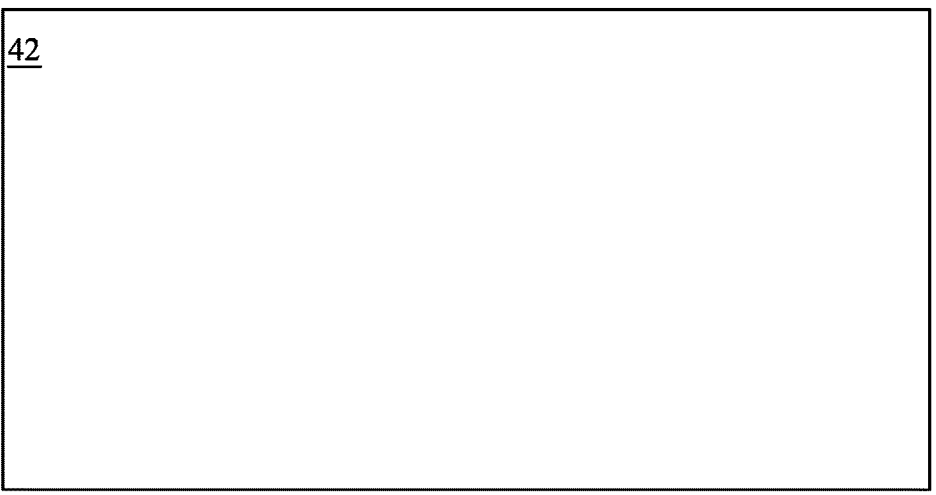

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Self-aligned patterning processes use a mandrel layer which is photo patterned. Due to pattern loading effects, the mandrel layer is usually patterned with a regularly spaced pattern. Then the mandrel layer is covered by a conformal spacer layer which is anisotropically etched to form sidewall spacers for the mandrels. Then, the mandrels are removed, leaving an etch mask which has a higher density and smaller pitch between masking structures. This process can be customized to form particular patterns by including a reverse material over the spacer layer, which protects a part of the spacer layer from being etched and essentially recovers a portion of the mandrel layer so that the regularly spaced pattern can be tweaked or customized to change the final pattern. When forming this reverse material, a photo mask structure may be used. Embodiment processes utilize an amorphous carbon bottom layer which is deposited by a CVD process. The resulting film allows for much greater flexibility in depositing material layers over the bottom layer, including for example, other layers of the photo mask and the reverse material. Topography issues that could otherwise arise, for example, by utilizing a spin-on-carbon or other spin-on material are resolved because the CVD deposition and amorphous carbon material result in an improved and more stable bottom layer. Overlying layers may be deposited at higher temperatures so that higher quality films may be used. Some embodiments utilize a three layer mask structure, while other embodiments utilize a two-layer mask structure including a metal oxide upper photoresist layer.

FIGS. 1A and 1B through 27A and 27B illustrate cross-sectional and top-down views of intermediate stages in the formation of conductive features in a target layer of a device in accordance with some embodiments. Figures ending in an "A" illustrate the cross-sectional views of a portion of a structure, and Figures ending in a "B" illustrate a corresponding top-down view of the portion of the structure. The structure illustrated in FIGS. 1A and 1B may be part of a wafer with many devices being formed thereon at the same time or may be an individual device.

Figure 1A:
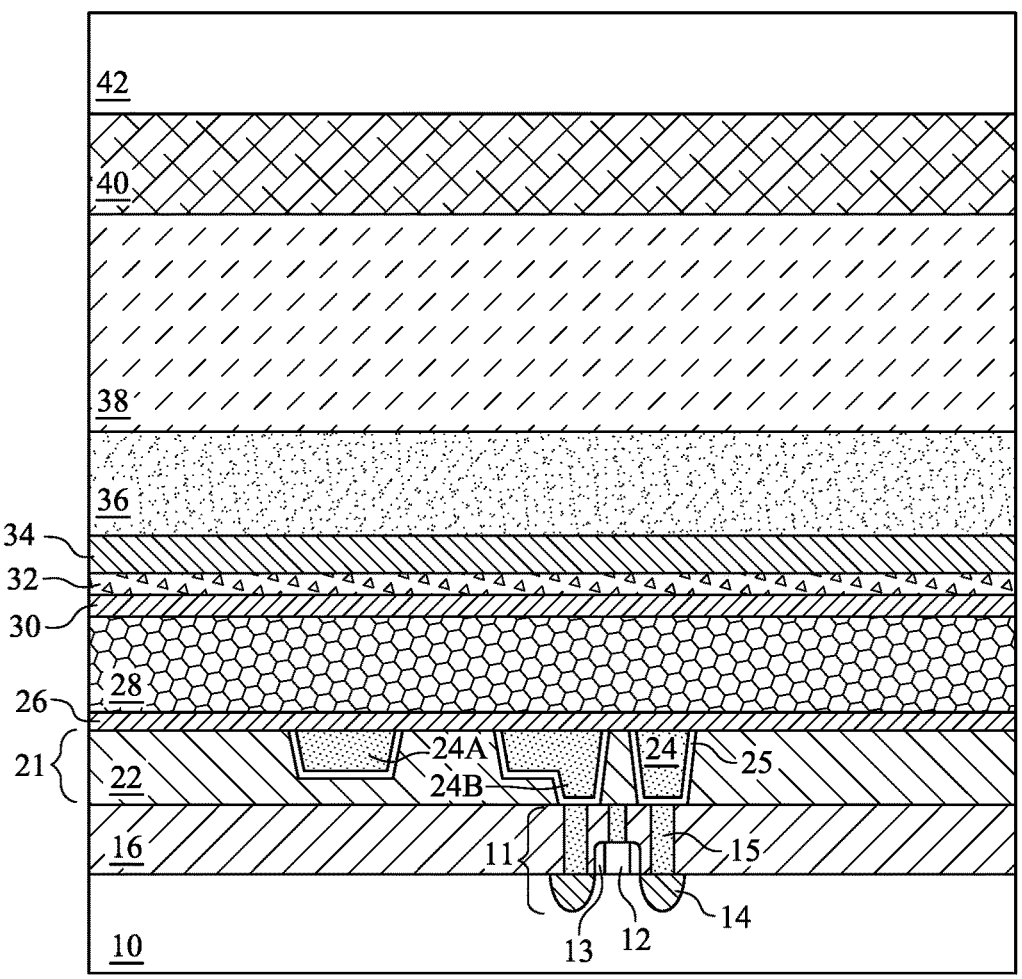

FIGS. 1A and 1B illustrate workpiece 100, which includes substrate 10 and the overlying layers. Substrate 10 may be formed of a semiconductor material such as silicon, silicon germanium, or the like. In some embodiments, substrate 10 is a crystalline semiconductor substrate such as a crystalline silicon substrate, a crystalline silicon carbon substrate, a crystalline silicon germanium substrate, a III-V compound semiconductor substrate, or the like. In an embodiment the substrate 10 may comprise bulk silicon, doped or undoped, or an active layer of a silicon-on-insulator (SOI) substrate. Generally, an SOI substrate comprises a layer of a semiconductor material such as silicon, germanium, silicon germanium, or combinations thereof, such as silicon germanium on insulator (SGOI). Other substrates that may be used include multi-layered substrates, gradient substrates, or hybrid orientation substrates.

In some embodiments, the illustrated structure is part of an interposer with no active or passive devices, while in other embodiments, the illustrated structure may include active and/or passive devices disposed therein. In some embodiments, devices (e.g., transistor 11) may be formed at a top surface of or within substrate 10. Active devices may comprise a wide variety of active devices such as transistors and the like and passive devices may comprise devices such as capacitors, resistors, inductors and the like that together may be used to generate the desired structural and functional parts of the design. The active devices and passive devices may be formed using any suitable methods either within or else on the substrate 10. For example, one device may be transistor 11, which includes a gate electrode 12, gate spacers 13, and source/drain regions 14. Gate and source/drain contacts 15 can be used to electrically couple to transistor 11. Transistor 11 may be a fin or planar field effect transistor (FET), and may be an n-type or p-type transistor or part of a complimentary metal-oxide semiconductor (CMOS). A dielectric layer 16 may include one or more layers of dielectric material in which gate and source/drain contacts structures 15 are electrically coupled to active devices and passive devices.

The metallization structure 21 is formed over substrate 10. Metallization structure 21 includes a dielectric layer 22 with conductive features 24 formed therein. Metallization structure 21 may be a layer of an interconnect or redistribution structure which may have additional layers. For example, metallization structure 21 may include a dielectric layer 22, such as an Inter-Metal Dielectric (IMD) layer or an Inter-Layer Dielectric (ILD) layer, which may include a dielectric material having a low dielectric constant (k value) lower than 3.8, lower than about 3.0, or lower than about 2.5, for example, and conductive features 24. The dielectric layer 22 of the metallization structure 21 may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), MethylSilsesQuioxane (MSQ), or the like.

Metallization structure 21 (including one or more layers) is formed over the substrate 10 and the devices and is designed to connect the various devices to form functional circuitry for the circuit design. In an embodiment, the metallization structure 21 is formed of alternating layers of dielectric and conductive material and may be formed through any suitable process (such as deposition, damascene, dual damascene, etc.). In an embodiment there may be one to four layers of metallization separated from the substrate 10 by at least one interlayer dielectric layer (ILD), but the precise number of layers is dependent upon the design.

The conductive features 24 may include metal lines 24A and conductive vias 24B. Metal lines 24A may be formed in an upper portion of a layer of the metallization structure 21, and may be used for routing signals. Conductive vias 24B may extend through the dielectric layer 22 to contact underlying features such as the source/drain contacts 15. In an embodiment, the conductive features 24 may be a material such as copper formed using, e.g., a damascene or dual damascene process, whereby an opening is formed within the dielectric layer 22, the opening is filled and/or overfilled with a conductive material such as copper or tungsten, and a planarization process is performed to embed the conductive features 24 within the dielectric layer 22. However, any suitable material and any suitable process may be used to form the conductive features 24. In some embodiments, a barrier layer 25 may surround the conductive features 24 and may be used as a diffusion barrier layer for preventing undesirable elements, such as copper, from diffusing into the surrounding dielectric material of the dielectric layer 22, for example, if the dielectric material of the dielectric layer 22 is a low-k dielectric material. In some embodiments, conductive features 24 may be contacts of a die.

Etch stop layer (ESL) 26 may comprise a dielectric material such as aluminum oxide, silicon carbide, silicon nitride, or the like. ESL 26 may be formed of a nitride, a silicon-carbon based material, a carbon-doped oxide, and/or combinations thereof. ESL 26 may be formed of a metallic material. In some embodiments, the ESL 26 may also function as an anti-reflective coating to assist in subsequent patterning. The formation methods include Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In accordance with some embodiments, ESL 26 is also used as a diffusion barrier layer for preventing undesirable elements, such as copper, from diffusing into the subsequently formed low-k dielectric layer. ESL 26 may include Carbon-Doped Oxide (CDO), carbon-incorporated silicon oxide (SiOC) or oxygen-Doped Carbide (ODC). ESL 26 may also be formed of Nitrogen-Doped silicon Carbide (NDC).

Further illustrated in FIGS. 1A and 1B is dielectric layer 28 formed over ESL 26. In accordance with some embodiments of the present disclosure, dielectric layer 28 is formed of a low-k dielectric material having a dielectric constant (k-value) lower than about 3.0, about 2.5, or even lower. Dielectric layer 28 may be formed using a material selected from the same group of candidate materials for forming dielectric layer 22. When selected from the same group of candidate materials, the materials of dielectric layers 22 and 28 may be the same or different from each other. In accordance with some embodiments, dielectric layer 28 is a silicon and carbon containing low-k dielectric layer. Dielectric layer 28 may also be referred to as a target layer 28, which will have openings formed therein according to a plurality of patterns and filled with metal lines and plugs, in accordance with embodiments of the present disclosure.

In some embodiments, over low-k dielectric layer 28 resides a mask 30. In some embodiments, mask 30 may be a dielectric hard mask and may be referred to as dielectric hard mask 30, which may be formed of silicon oxide (such as a tetraethylorthosilicate (TEOS) formed silicon oxide), Nitrogen-Free Anti-Reflective Coating (NFARC, which is an oxide), silicon carbide, silicon oxynitride, or the like. The formation methods include Plasma Enhance Chemical Vapor Deposition (PECVD), High-Density Plasma (HDP) deposition, or the like.

A mask 32 is formed over mask 30 or dielectric layer 28. In some embodiments mask 32 may be a hard mask and may also be referred to as hard mask 32. In some embodiments, hard mask 32 is a metal hard mask and may include one or more metals, such as titanium (Ti) or tantalum (Ta). In some embodiments, the metal of hard mask 32 may be in the form of a metal nitride such as titanium nitride (TiN) or tantalum nitride (TaN). In some embodiments, hard mask 32 is formed of tungsten doped carbide (WDC, also known as tungsten doped silicon carbide). In some embodiments, hard mask 32 may be formed of a non-metal nitride such as silicon nitride, an oxynitride such as silicon oxynitride, or the like. The formation methods of hard mask 32 include Physical Vapor Deposition (PVD), Radio Frequency PVD (RFPVD), Atomic Layer Deposition (ALD), or the like.

Dielectric mask layer 34 is formed over mask 32. In some embodiments, dielectric mask layer 34 may be a hard mask and may be referred to as mask layer 34. Mask layer 34 may be formed using processes and materials similar to those discussed above with respect to the dielectric hard mask 30, and may be formed using a method that is selected from the same group of candidate methods for forming dielectric hard mask 30. Dielectric hard mask layer 30 and mask layer 34 may be formed of the same material, or may comprise different materials. In some embodiments, mask layer 34 may be patterned after deposition to expose portions of the underlying hard mask 32. In such embodiments, the mask layer 34 may be used to etch the underlying target layer 28 to different depths.

Mandrel layer 36 is formed over mask layer 34. In some embodiments, mandrel layer 36 is formed of amorphous silicon or another material that has a high etching selectivity with the underlying mask layer 34. Mandrel layer 36 may have a thickness of about 300 to about 800 Å, such as about 500 Å, and may be formed using any suitable process, such as by CVD or PECVD. After mandrel layer 36 is patterned as described below, a reverse material may be selectively deposited thereon, to provide flexibility in patterning the target layer 28. The combination of the mandrels, the self-aligned mask, and reverse material will be used in a subsequent process for a self-aligned patterning process which will result in patterning the target layer 28.

Still referring to FIGS. 1A and 1B, a tri-layer is formed over the mandrel layer 36, the tri-layer comprising a bottom layer 38, a middle layer 40 over the bottom layer 38, and an upper layer 42 (also referred to as top layer) over the middle layer 40. The bottom layer 38 may be formed of an organic material, such as a polymer photo resist material like sacrificial carbon or spin-on-carbon. In some embodiments, the process temperature during depositing the bottom layer 38 may be between about 100° C. and 250° C. The stress of the bottom layer 38 may be between about 0 MPa and about 50 MPa. The hardness of the bottom layer 38 may be between about 0 GPa and 1 GPa, while the modulus may be between about 9 GPa and 15 GPa. The density of the bottom layer 38 may be between about 0.9 and 1.3 g/cm$^3$. The material composition of the bottom layer 38 may be 76.4% carbon, 4.5% hydrogen, and 19.1% oxygen by molecular weight.

The middle layer 40 may comprise an inorganic material, which may be a carbide (such as silicon oxycarbide), a nitride (such as silicon nitride), an oxynitride (such as silicon oxynitride), an oxide (such as silicon oxide), e.g, spin-on-glass, or the like. The upper layer 42 may be formed of an organic photo resist material, such as a polymer. The middle layer 40 has a high etching selectivity with relative to upper layer 42 and bottom layer 38, and hence upper layer 42 is used as an etching mask for the patterning of middle layer 40, and middle layer 40 is used as an etching mask for the patterning of bottom layer 38.

Each layer of the tri-layer may be formed using respectively suitable processes. In some embodiments, the bottom layer 38, middle layer 40, and the upper layer 42 may be each be formed by a spin on process, or may alternatively be formed by any suitable deposition process.

The thickness of the bottom layer 38 may be between about 250 and 1200 Å. The thickness of the middle layer 40 may be between about 100 and 350 Å. The thickness of the upper layer 42 may be between about 300 and 1000 Å. Although example ranges and thicknesses of the layers are provided, other thicknesses of these layers can be used.

Figure 2B:
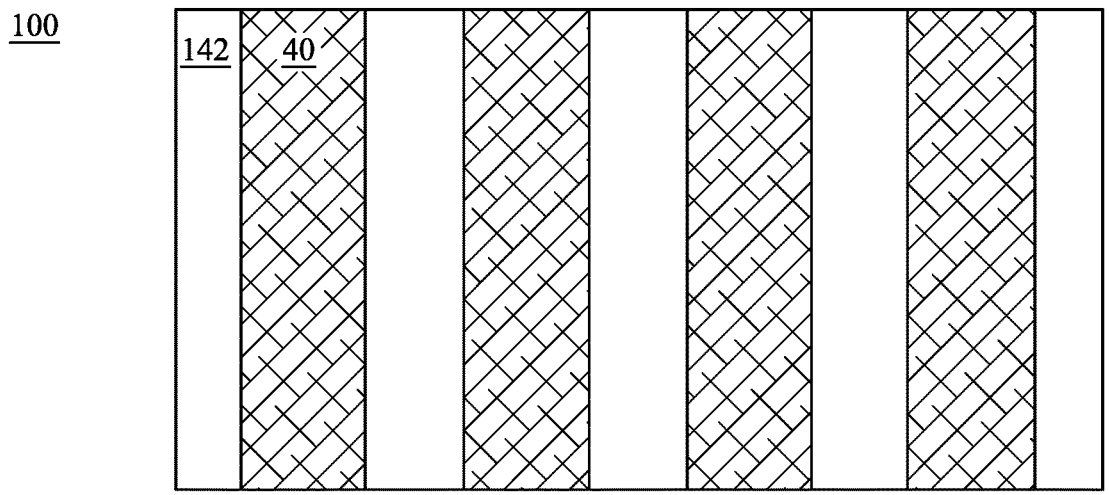
Figure 2A:
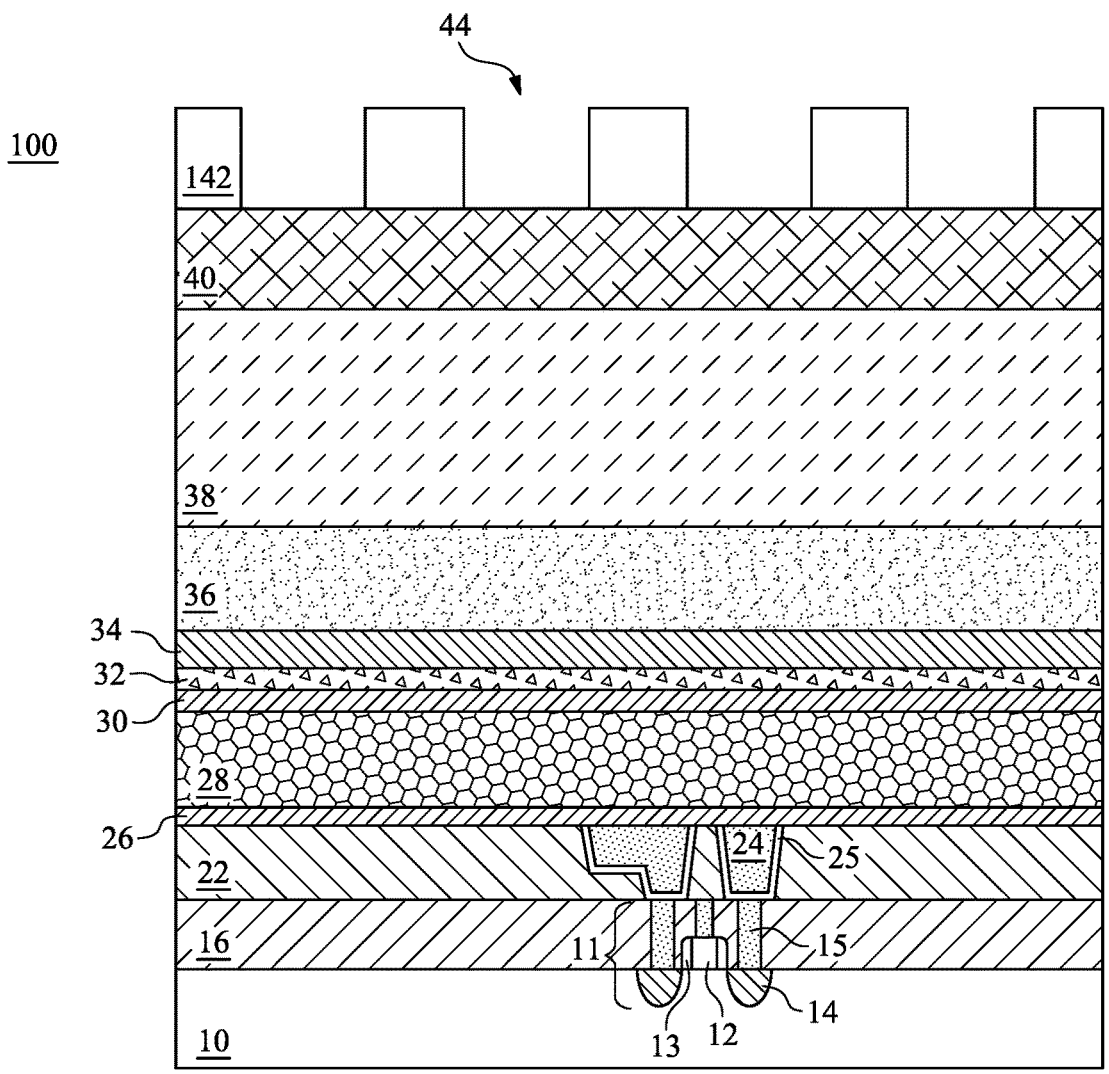

In FIGS. 2A and 2B, after the upper layer 42 is formed, upper layer 42 is patterned to form patterned upper later 142 using an acceptable photolithography technique, for example, by exposing the upper layer 42 to light through a light mask and developing the upper layer 42 to remove portions thereof which were or were not exposed to the light (depending on whether a positive-type or negative-type photomask is used). The patterned upper layer 142 includes openings 44 therein.

Figure 3B:
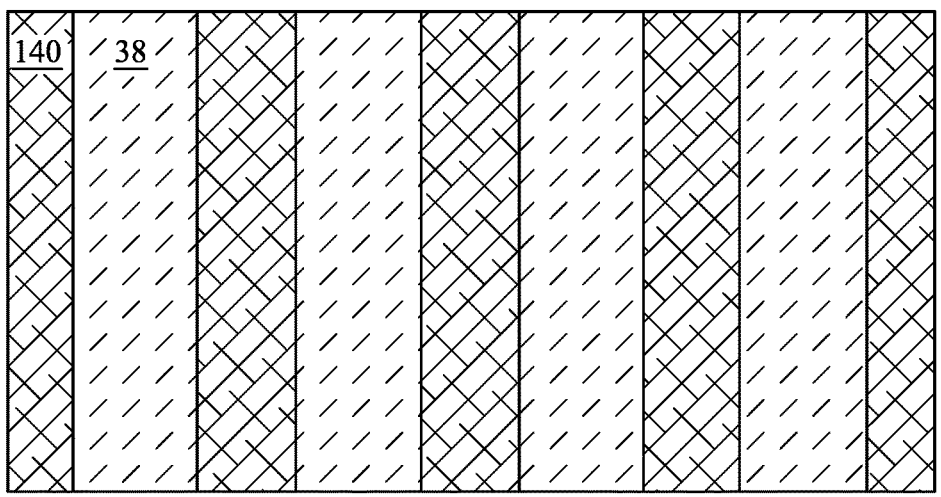
Figure 3A:
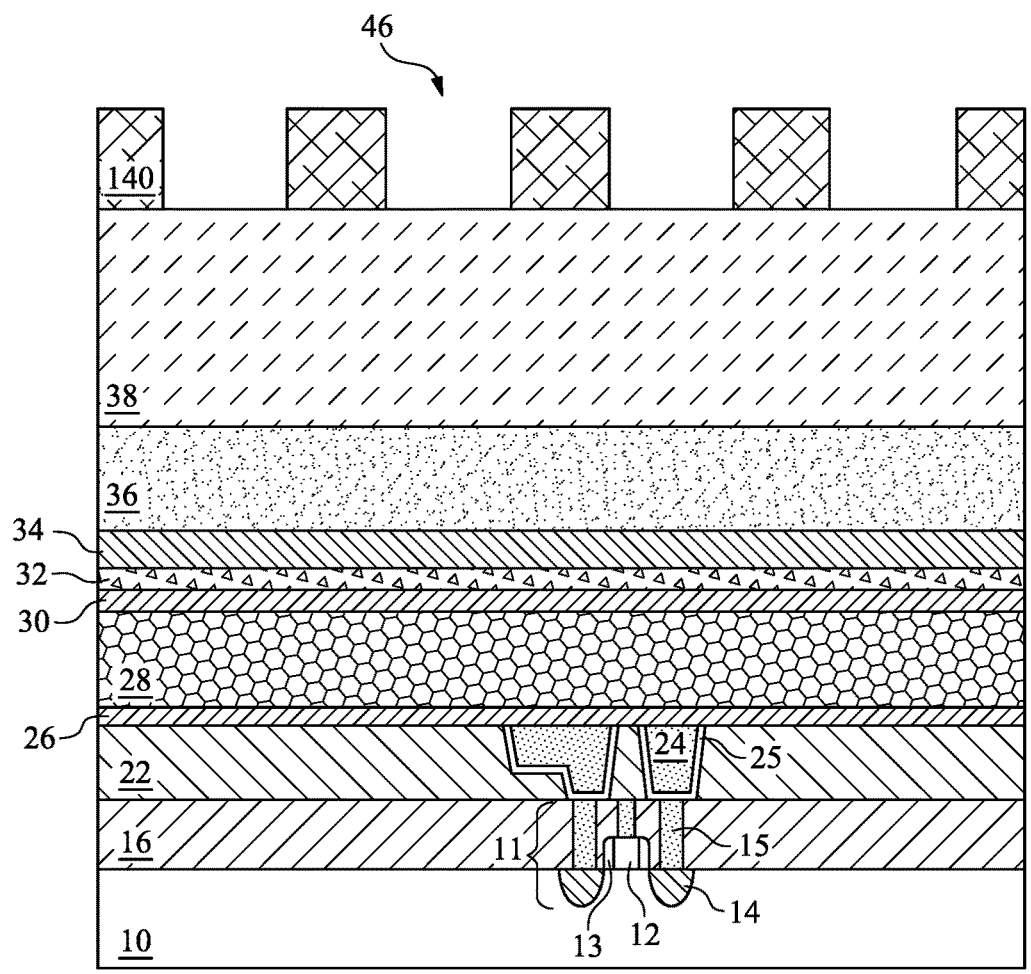

In FIGS. 3A and 3B, the middle layer 40 is etched to form patterned middle layer 140, which may also be referred to as middle layer 140. Middle layer 40 is etched using the patterned upper layer 142 (FIGS. 2A and 2B) as an etching mask, so that the pattern of patterned upper layer 142 is transferred to middle layer 40 to create patterned middle layer 140. During the patterning of middle layer 140, upper layer 142 may be partially, or entirely, consumed. Etching the middle layer 40 result in openings 46 in the patterned middle layer 140 which have been extended from openings 44. Any suitable etching technique may be used, such as a wet or dry etch using an etchant which is selective to the middle layer 140 material.

Figure 4B:
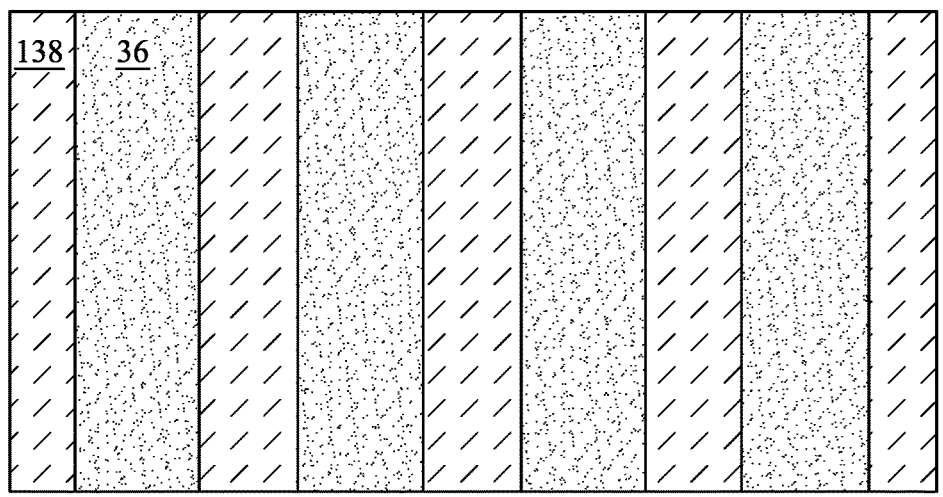
Figure 4A:
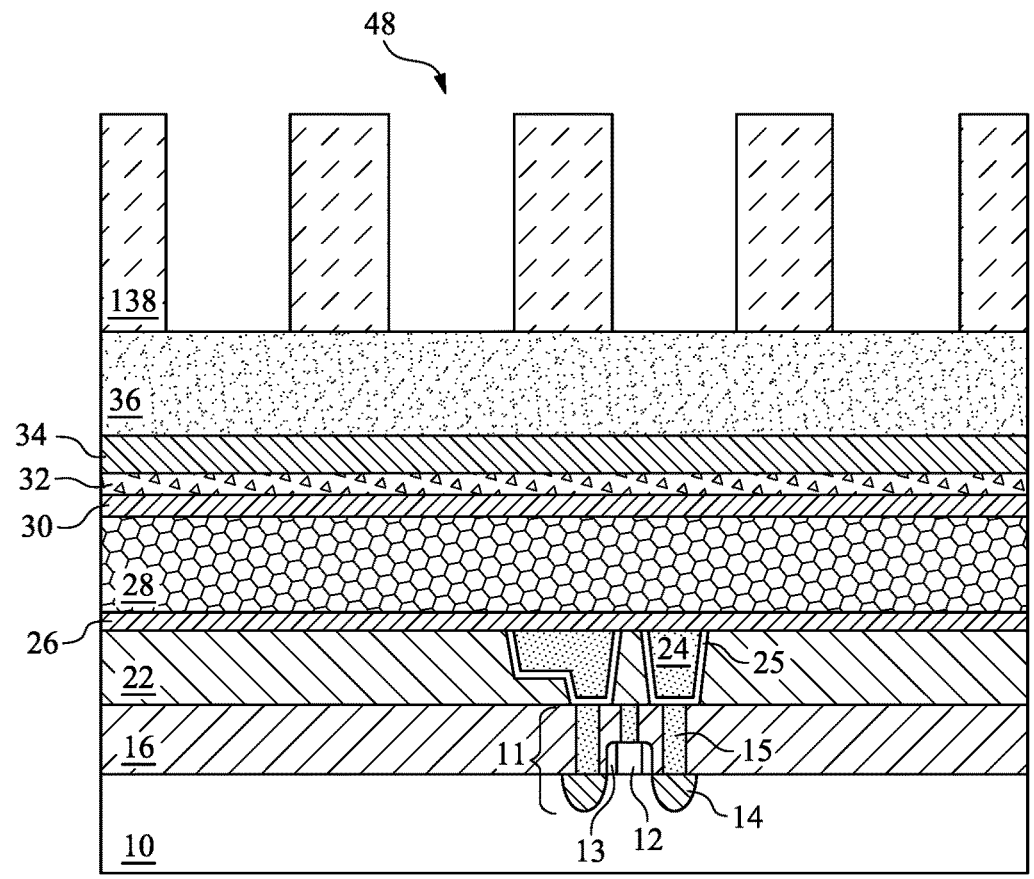

In FIGS. 4A and 4B, the bottom layer 38 is then etched to form patterned bottom layer 138, which may also be referred to as bottom layer 138. Bottom layer 38 is etched using the middle layer 140 (FIGS. 3A and 3B) as an etching mask, so that the pattern of middle layer 140 is transferred to bottom layer 38 to create a patterned bottom layer 138. The bottom layer 138 has openings 48 which have been extended from the openings 46 (FIG. 3A). Upper layer 142 will be fully consumed during the patterning of bottom layer 38 if it has not been fully consumed in the patterning of middle layer 140. Openings 48 may be tapered or may have vertical sidewalls, within process variations. Any suitable etching technique may be used, such as a wet or dry etch using an etchant which is selective to the material of bottom layer 138. For example, in some embodiments the etchant may be $O_2$ based or $N_2/H_2$ based etchant gas used in an etching chamber with other process gasses.

Figure 5B:
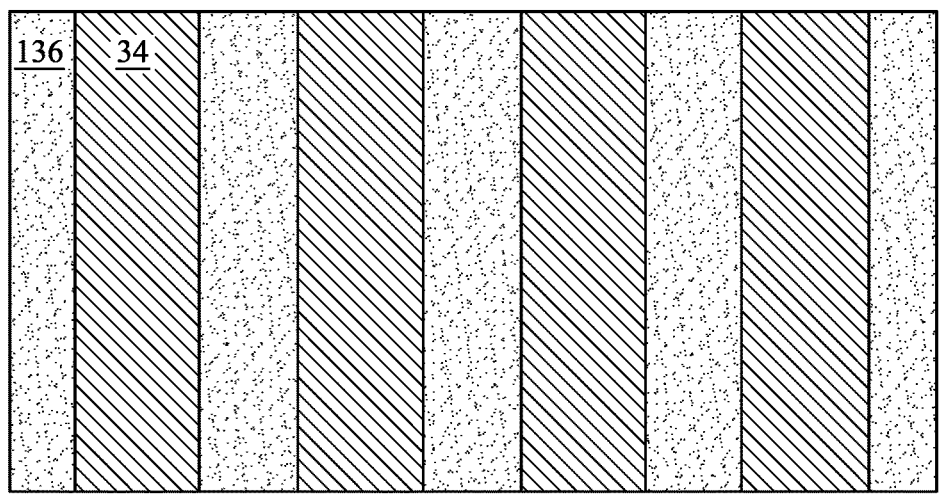
Figure 5A:
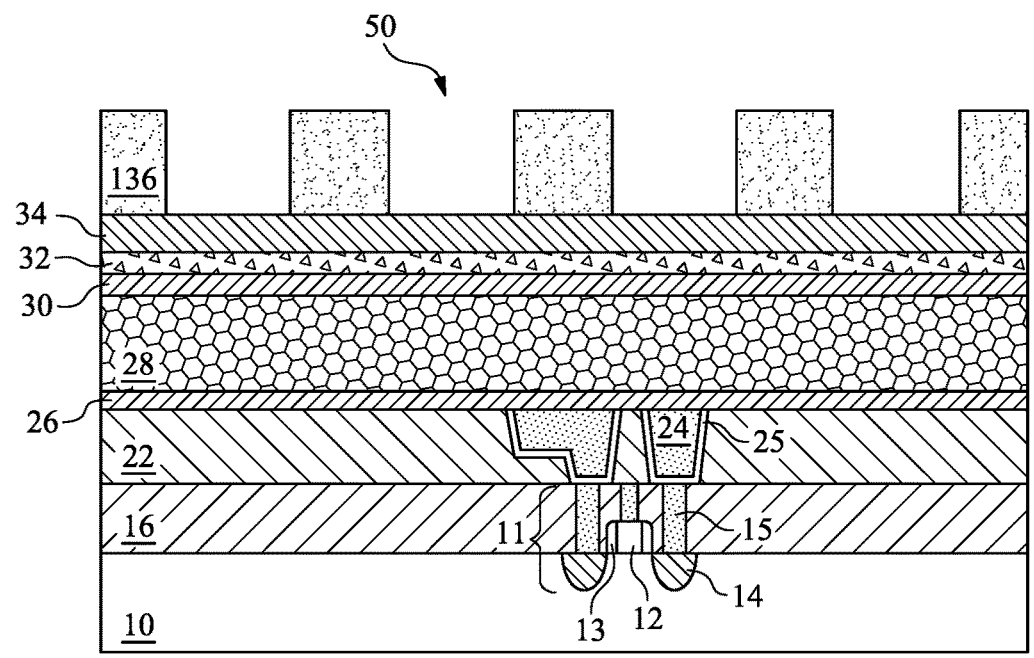

FIGS. 5A and 5B illustrate an anisotropic etching of mandrel layer 36 of FIGS. 4A and 4B to form patterned mandrel layer 136, which may also be referred to as mandrels 136. Mandrel layer 36 is etched using the patterned bottom layer 138 as an etching mask, so that the pattern of bottom layer 138 is transferred to mandrel layer 36 to create the patterned mandrel layer 136. The patterned mandrel layer 136 has openings 50 which have been extended from openings 48 (FIG. 4A). The etching technique may include a dry etch using a suitable etchant. In some embodiments, the etchant selected for etching the patterned mandrel layer 136 may be a fluorine free etchant, such as a chlorine based etchant. In other embodiments, other etchants may be used, including fluorine based etchants. Mask layer 34 under the patterned mandrel layer 136 may serve as an etch stop layer for the etching through of the mandrel layer 36. Openings 50 are formed as a result of the etching of the patterned mandrel layer 136. Following the etching of the patterned mandrel layer 136, the bottom layer 138 may be removed by an ashing process.

Figure 6B:
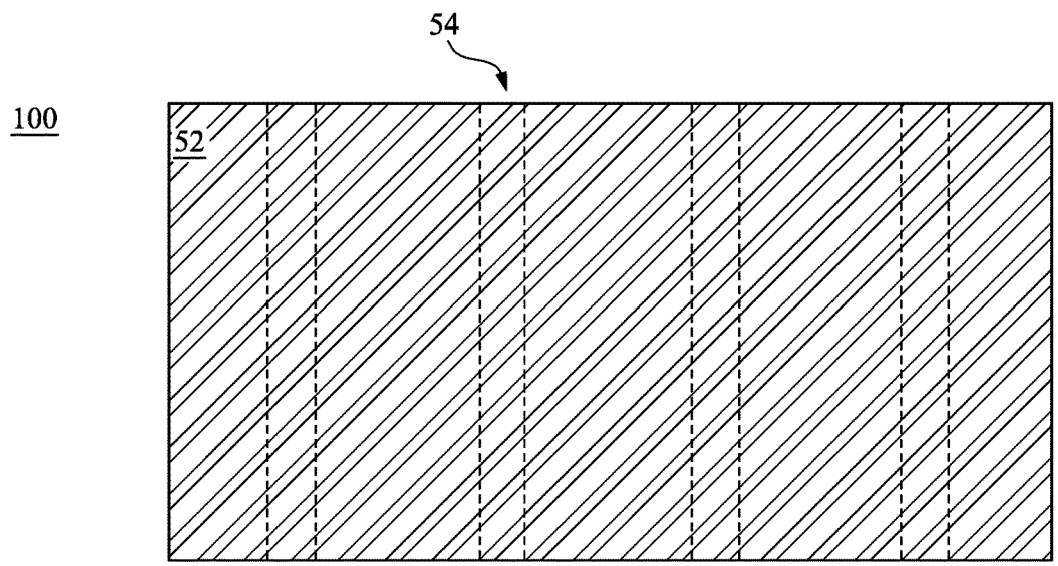
Figure 6A:
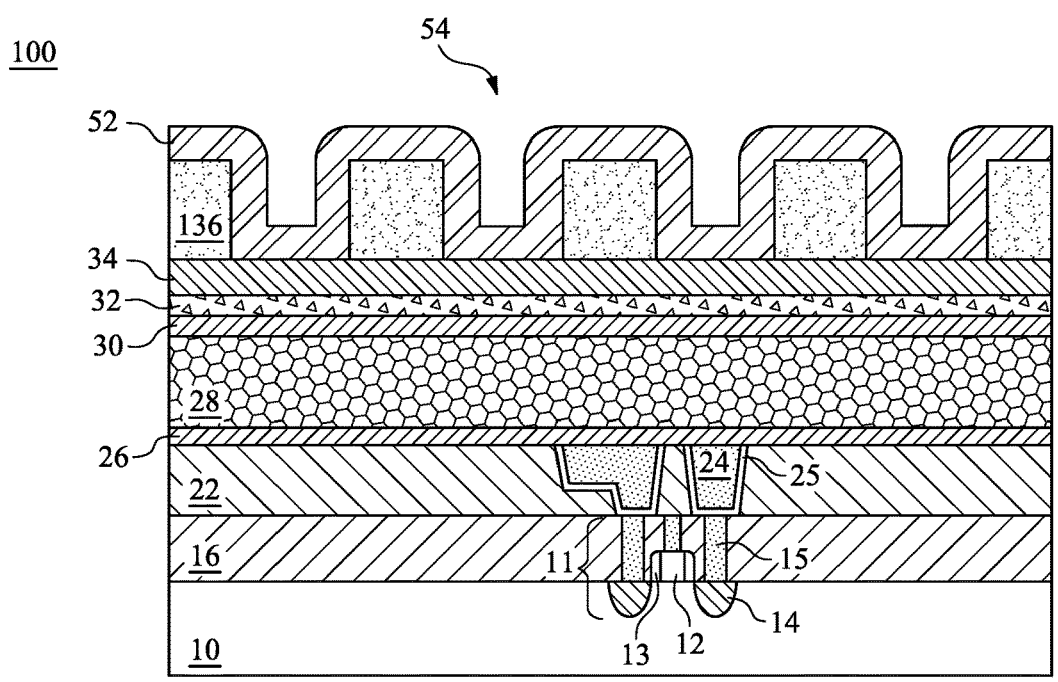

In FIGS. 6A and 6B, a spacer layer 52 may be deposited over the patterned mandrel layer 136. The spacer layer 52 may be made of a suitable oxide or nitride insulating or dielectric material which is deposited using a deposition technique suitable to form a substantially conformal layer (for example, such that the horizontal portions and vertical portions of the spacer layer 52 vary by 25% or less). Such deposition techniques may include, for example, PECVD, HDPCVD, ALD, CVD, LPCVD, PVD, and the like. FIG. 6B includes dashed lines which represent lower portions of the spacer layer 52.

Figure 7B:
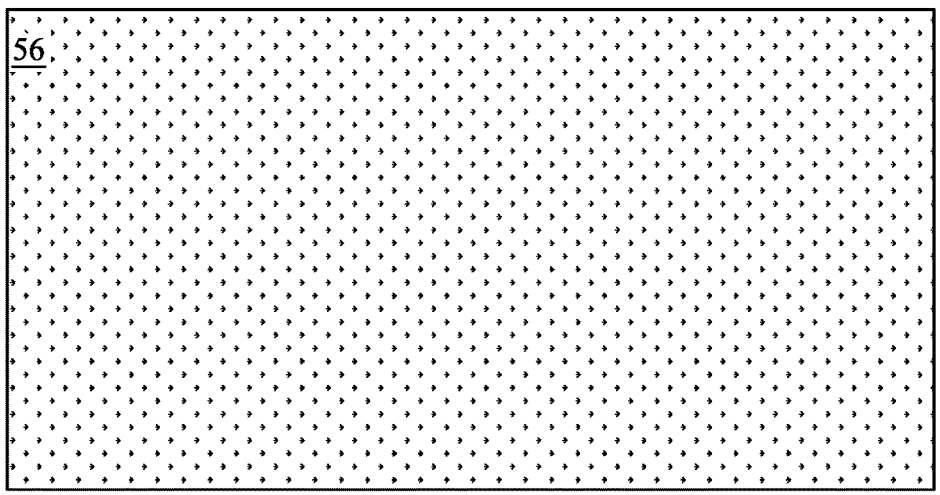
Figure 7A:
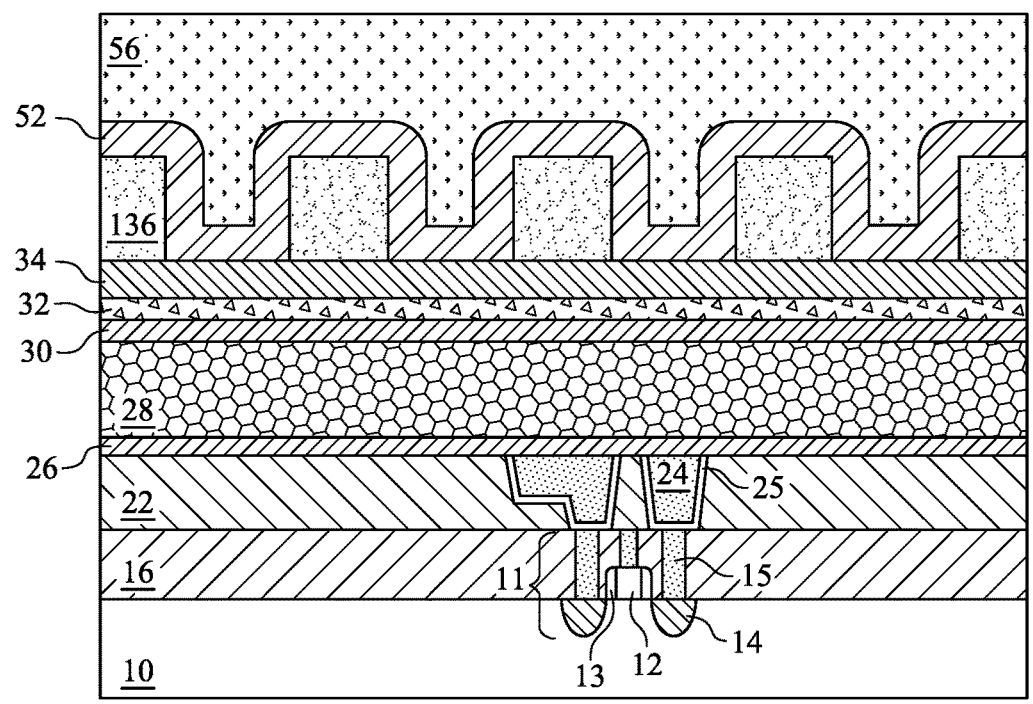

Next, as illustrated in FIGS. 7A and 7B, a bottom layer 56 of a masking structure may be deposited in the openings 54 (see FIG. 6A) and over the spacer layer 52. The bottom layer 56 may be used as part of a masking structure that includes two or three layers. In some embodiments, the bottom layer 56 can serve as a deposition guide for depositing a reverse material over portions of the spacer layer 52. The reverse material fills in portions of the patterned mandrel layer 136 which were previously removed to effectively recover those portions, for patterning purposes. Rather than deposit the bottom layer 56 by a spin on process, the bottom layer 56 is deposited by a plasma enhanced CVD process, which provides better gap fill ability than a spin on process. The spacer layer 52 has alternating high points and low points and a deposition process with superior gap fill ability provides a better foundation (improved topography) for a subsequently deposited reverse material. Also, rather than utilize a polymer for the material of the bottom layer 56, embodiments utilize amorphous carbon. Amorphous carbon can withstand higher temperatures than a typical polymer and thus, can support a wider variety of films deposited thereon for the reverse material, middle layer, or upper layer. Further, by using amorphous carbon, the overlying material layers may be deposited more quickly, with better material consistency, and with higher deposition temperatures to produce higher quality films.

In some embodiments, the CVD process used to deposit the amorphous carbon may be a plasma enhanced process using a process temperature between 200° C. and 400° C. A gaseous $C_xH_y$ precursor (where x and y are each compatible indexes with one another), such as $C_2H_2$, $CH_4$, $C_3H_6$?, and so forth, may be converted to a solid and deposited on the spacer layer 52 as amorphous carbon. The reaction used to deposit the amorphous carbon may be characterized as follows:

$$Ar^+ + C_xH_y \rightarrow Ar + C_xH_y^+ \quad \text{(eq. 1)}$$

$$C_xH_y^+ + e \rightarrow C_xH_{(y-1)} + H \quad \text{(eq. 2)}$$

$$e + C_xH_{(y-1)} \rightarrow C_xH_{(y-1)}^+ + 2e \quad \text{(eq. 3)}$$

Argon may be provided to a deposition chamber and a plasma of the argon gas generated therefrom using a radio frequency source. A hydrocarbon gas, such as acetylene, methane, etc., is introduced into the deposition chamber. Argon ions interact with the hydrocarbon gas, thereby dislodging electrons from the hydrocarbon gas and creating ions of the hydrocarbon gas in equation 1. Energized free electrons can interact with the hydrocarbon gas ions to dislodge a hydrogen atom from the hydrocarbon gas ions. Dislodging the hydrogen atom from the hydrocarbon gas ions neutralizes the molecule, converting the hydrocarbon gas into a solid in equation 2. Energized free electrons interact with the free-floating hydrocarbon solids, dislodging another electron from the hydrocarbon solids, thereby forming ions of the hydrocarbon solids in equation 3. The ions of the hydrocarbon solids are attracted to the surface of the spacer layer 52 and the bottom layer 56 as it grows. The bottom layer 56 is grown to extend over the spacer layer 52 and then the upper surface is levelled by an etching back process, a planarization process such as Chemical Mechanical Planarization (CMP), or combinations thereof.

The process temperature during depositing the bottom layer 56 may be between about 200° C. and 400° C. The stress characteristic of the bottom layer 56 may be between about 0 MPa and about-500 MPa. The hardness of the bottom layer 56 may be between about 10 GPa and 20 GPa, while the modulus may be between about 90 GPa and 110 GPa. The density of the bottom layer 56 may be between about 1 and 1.5 g/cm³. In some embodiments, the material composition of the bottom layer 56 may be between about 78% and 80% carbon, between about 19% and 21% hydrogen, and between about 0.4% and 3% oxygen as determined by Rutherford backscattering spectrometry (RBS). In some embodiments, the material composition of the bottom layer 56 may be between about 60% and 70% carbon, between about 30% and 40% hydrogen, and between about 1% and 5% oxygen RBS.

Figure 8B:
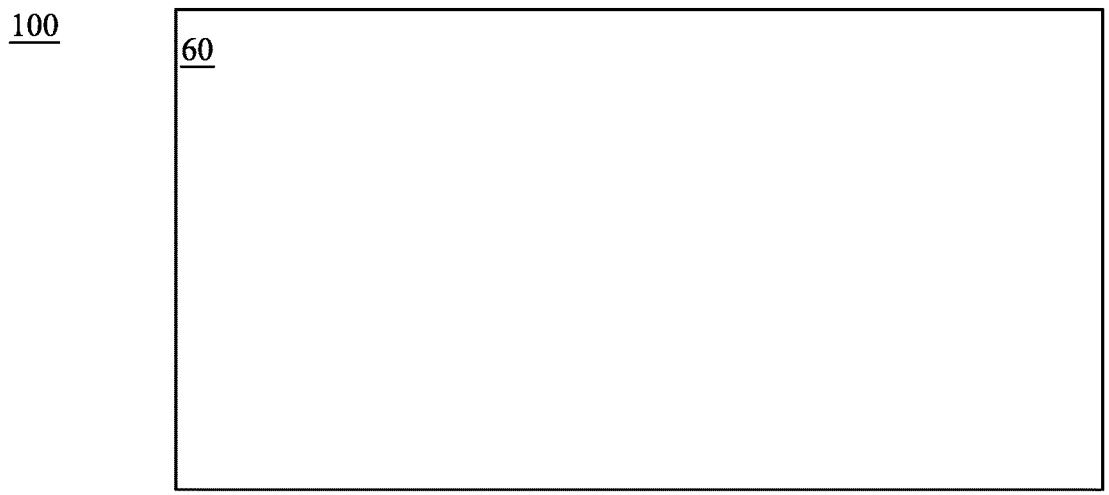
Figure 8A:
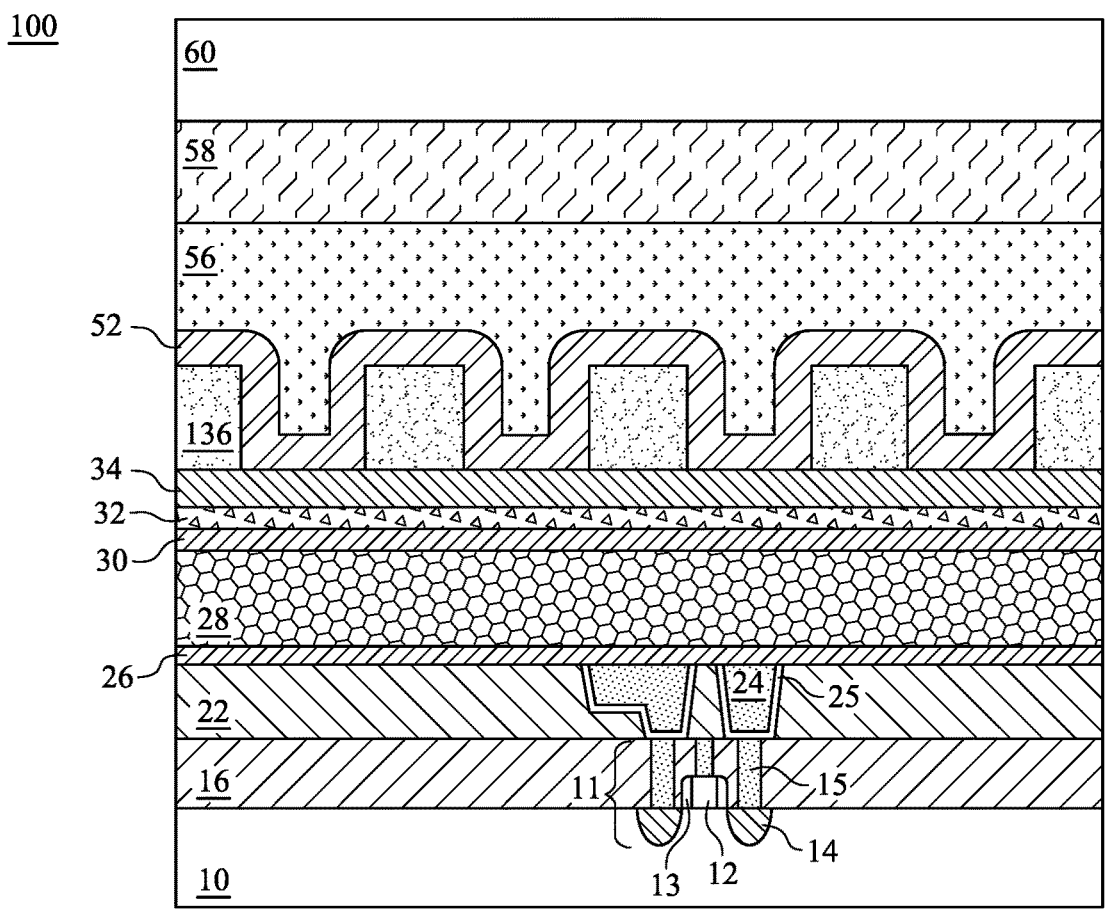

In FIGS. 8A and 8B, a middle layer 58 is deposited, followed by an upper layer 60. These layers may be formed using processes and materials similar to those discussed above with respect to the middle layer 40 and upper layer 42, discussed above. In some embodiments, the middle layer 58 and/or upper layer 60 may be deposited using other processes, such as a CVD process, instead of a spin on process. Normally, a CVD deposition process would likely damage the bottom layer 56, however, because the bottom layer 56 was deposited using CVD and provides the film qualities noted above, this allows the middle layer 58 to be deposited in a like manner, and the upper layer 60 to be deposited in like manner as well. Additionally, using CVD provides that the middle layer 58 (and/or upper layer 60) can be deposited in the same deposition chamber as the bottom layer 56, reducing the handling times of the workpiece 100. In some embodiments, the upper layer 60 may be a metal oxide photoresist instead of an organic photoresist.

In some embodiments, the alternative materials and alternative processes used to deposit the bottom layer 56, the middle layer 58, and the upper layer 60 may be used to deposit the bottom layer 38, the middle layer 40, and the upper layer 42, discussed above.

The thickness of the bottom layer 56 may be between about 250 and 1200 Å. The thickness of the middle layer 58 may be between about 100 and 350 Å. The thickness of the upper layer 60 may be between about 300 and 1000 Å. Although example ranges and thicknesses of the layers are provided, other thicknesses of these layers can be used.

Figure 9B:
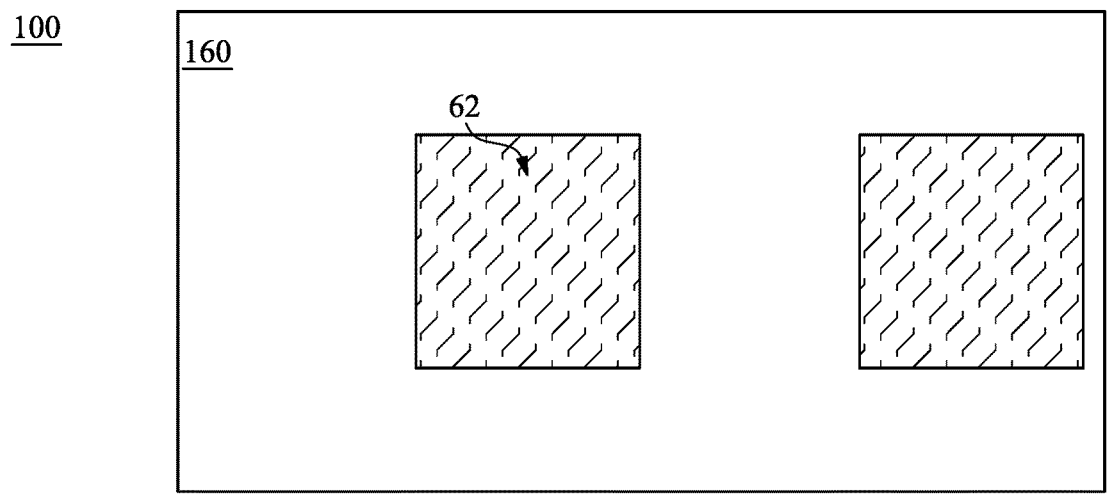
Figure 9A:
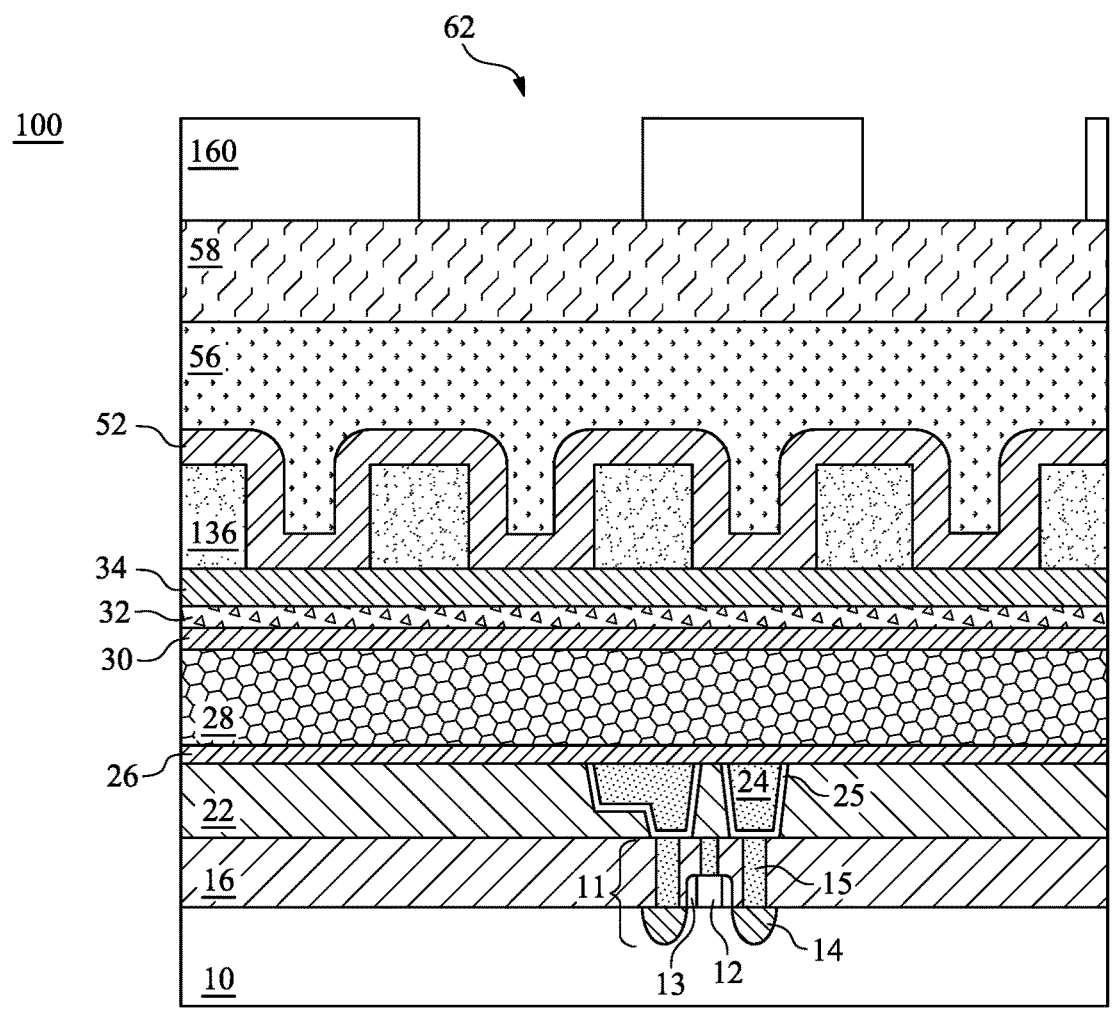

FIGS. 9A and 9B illustrate that after the upper layer 60 is formed, the upper layer 60 is patterned to form patterned upper later 160 using an acceptable photolithography technique. The patterned upper layer 160 includes openings 62 therein.

Figure 10B:
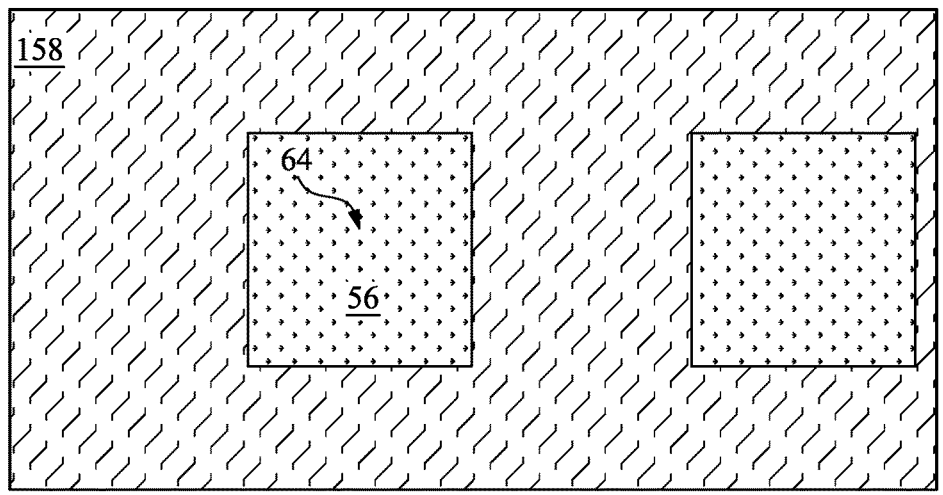
Figure 10A:
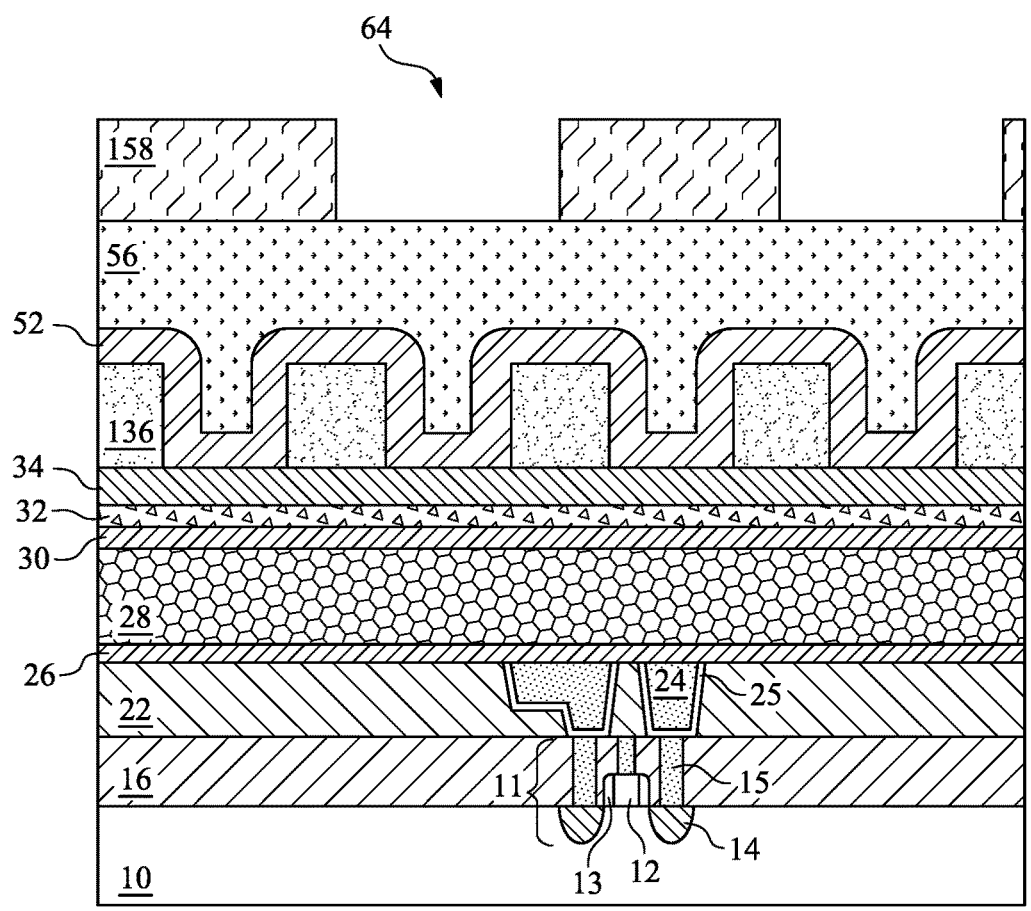

In FIGS. 10A and 10B, the middle layer 58 is etched to form patterned middle layer 158. Middle layer 58 is etched using the patterned upper layer 160 (FIGS. 9A and 9B) as an etching mask, so that the pattern of patterned upper layer 160 is transferred to middle layer 58 to create patterned middle layer 158. During the patterning of middle layer 158, patterned upper layer 160 may be partially, or entirely, consumed. Etching the middle layer 58 result in openings 64 in the patterned middle layer 158 which have been extended from openings 62. Any suitable etching technique may be used, such as a wet or dry etch using an etchant which is selective to the middle layer 158 material.

Figure 11B:
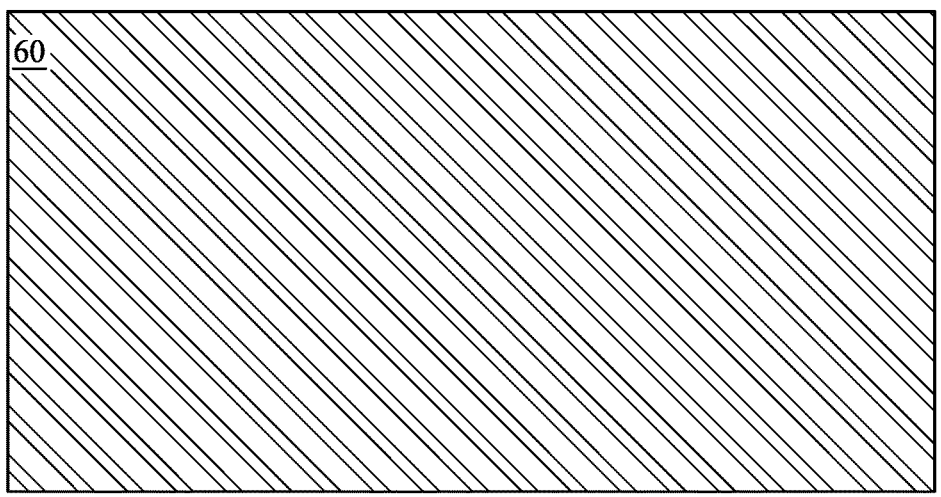
Figure 11A:
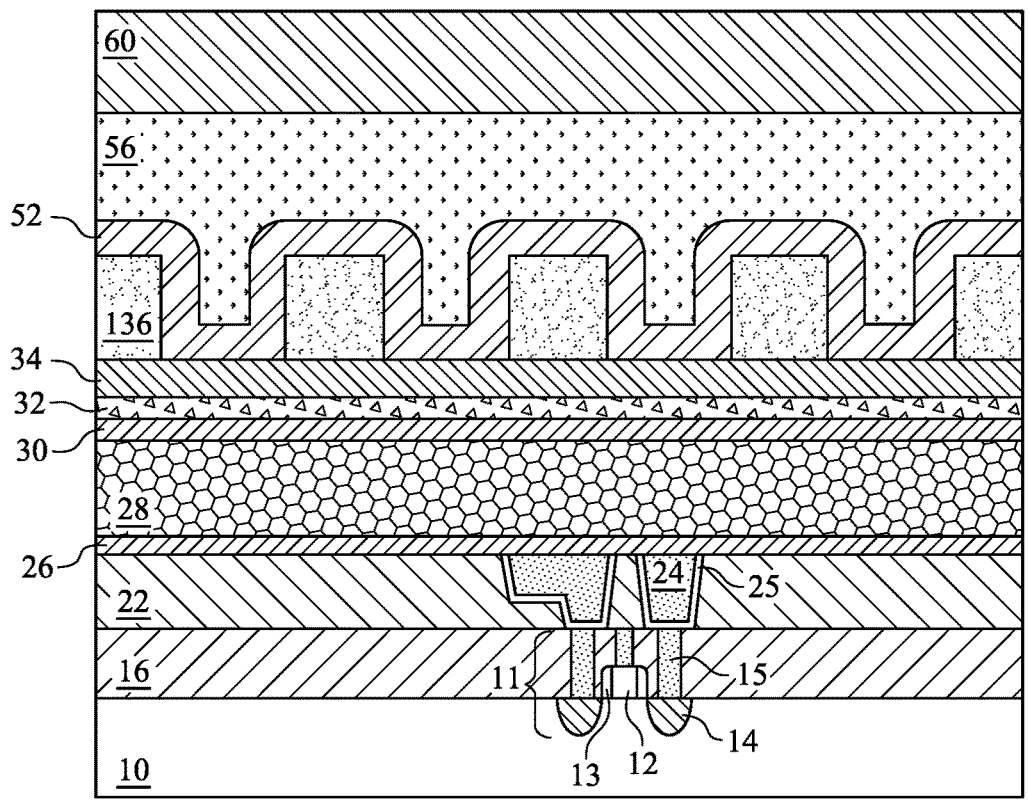

FIGS. 11A, 11B, 12A, and 12B illustrate a process which omits the middle layer 58, in accordance with some embodiments. In FIGS. 11A and 11B the upper layer 60 is formed directly on the bottom layer 56. Because the bottom layer 56 is formed of the amorphous carbon, an organic photoresist (such as found in the upper layer 42) may be used, while still maintaining good etch selectivity between the upper layer 60 and bottom layer 56. In some embodiments, the upper layer 60 may be replaced with a metal-oxide photoresist instead which allows better etch selectivity, still without the need for the middle layer 58. The upper layer 60 (including either the organic photoresist or the metal oxide photoresist) may be deposited using a spin on process or by a CVD deposition process. Normally, a CVD process would damage the bottom layer 56, however, because the bottom layer 56 was deposited by the CVD process and has the film characteristics described above, it can withstand higher temperature deposition processes.

Figure 12B:
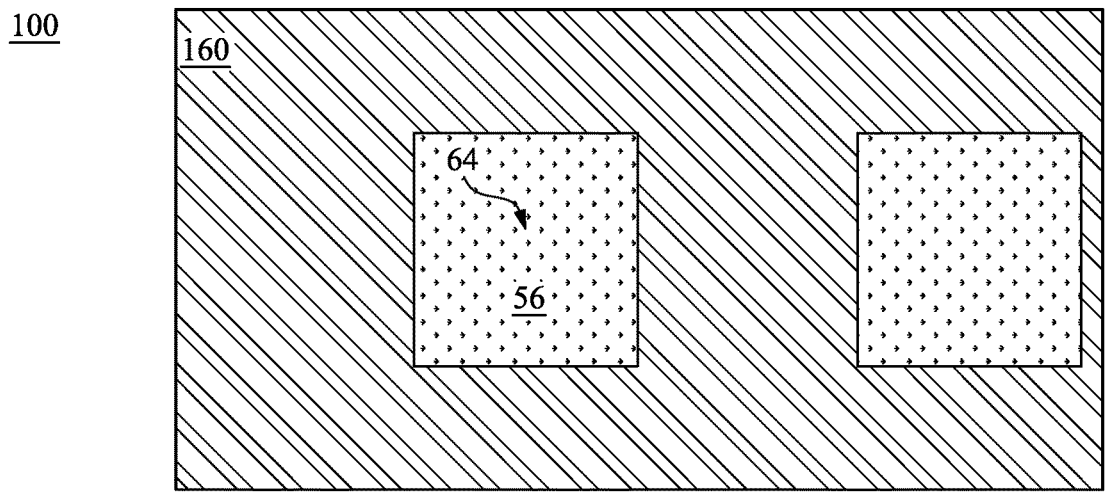
Figure 12A:
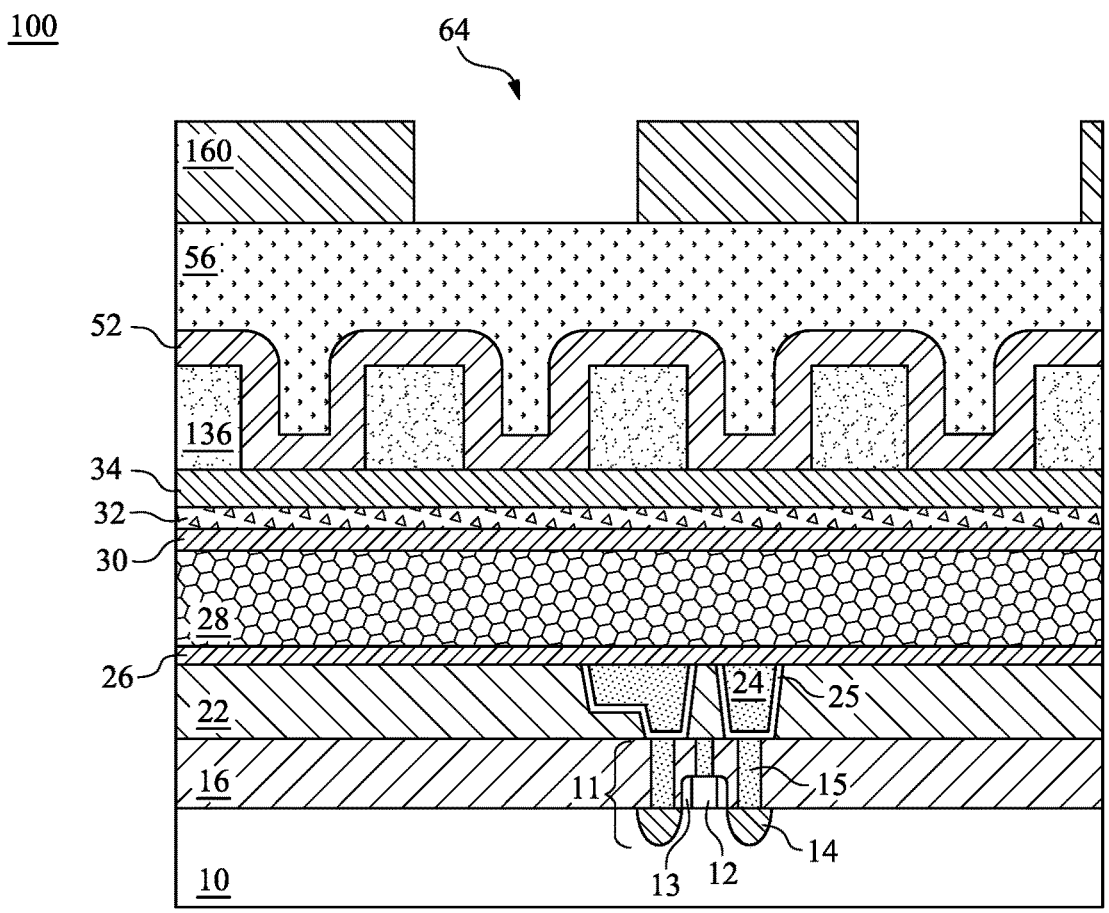

FIGS. 12A and 12B illustrate that after the upper layer 60 is formed, the upper layer 60 is patterned to form patterned upper later 160 using an acceptable photolithography technique. The patterned upper layer 160 includes openings 64 which expose portions of the bottom layer 56.

Figure 13B:
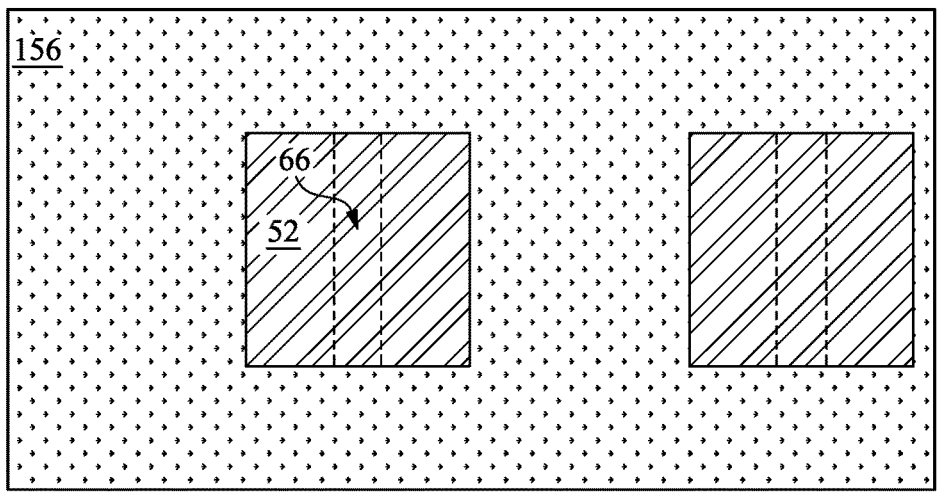
Figure 13A:
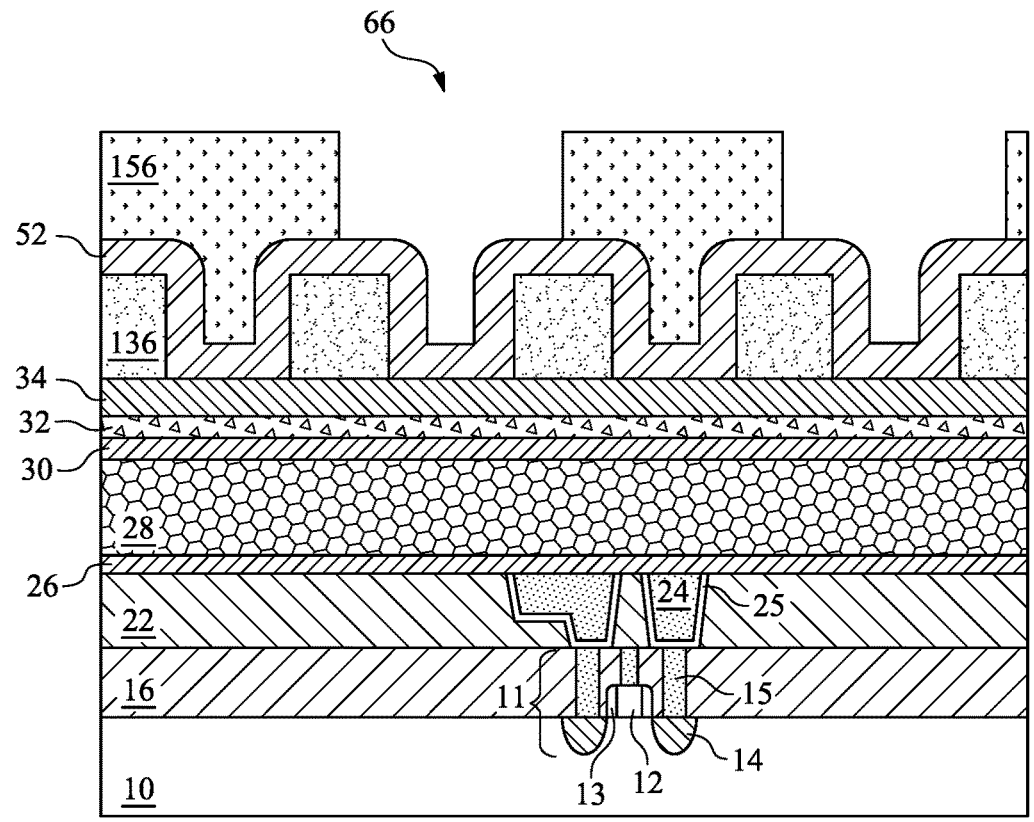

In FIGS. 13A and 13B, the bottom layer 56 is then etched to form patterned bottom layer 156, which may also be referred to as bottom layer 156. Bottom layer 56 is etched using the middle layer 158 (FIGS. 10A and 10B) or the upper layer 160 (FIGS. 12A and 12B) as an etching mask, so that the pattern of middle layer 158 (or upper layer 160) is transferred to bottom layer 56 to create the patterned bottom layer 156. The bottom layer 156 has openings 66 which have been extended from the openings 64 (FIG. 10A or 12A). Patterned upper layer 160 will be fully consumed during the patterning of bottom layer 156 if it was not fully consumed in the patterning of the middle layer 158. Openings 66 may be tapered or may have vertical sidewalls, within process variations. Any suitable etching technique may be used, such as a wet or dry etch using an etchant which is selective to the material of bottom layer 156. For example, in some embodiments the etchant may be an $O_2$ based or $N_2/H_2$ based etchant gas used in an etching chamber with other process gasses. Following the etching of the patterned bottom layer 156, the patterned middle layer 158 (if used) and upper layer 160 (if still remaining) may be removed by a suitable process.

Figure 14B:
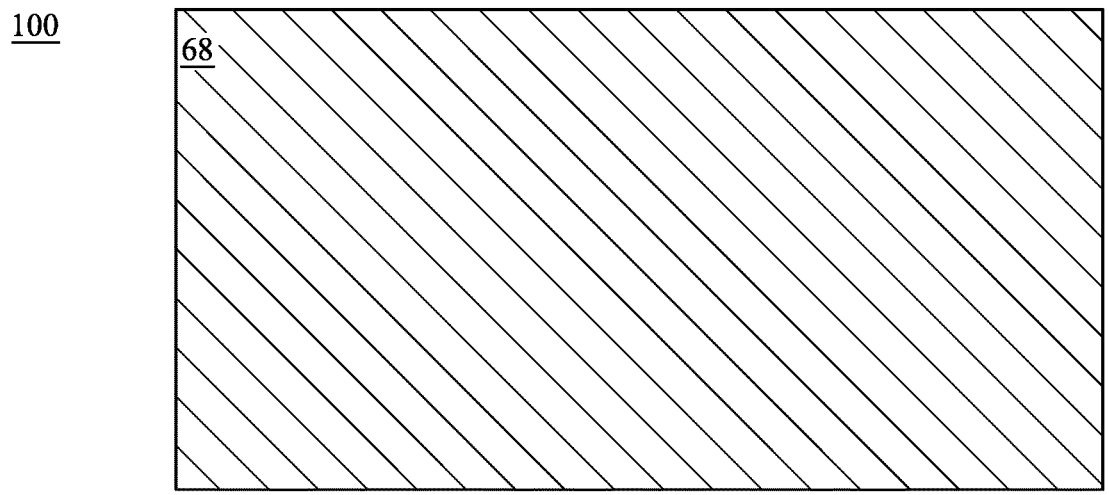
Figure 14A:
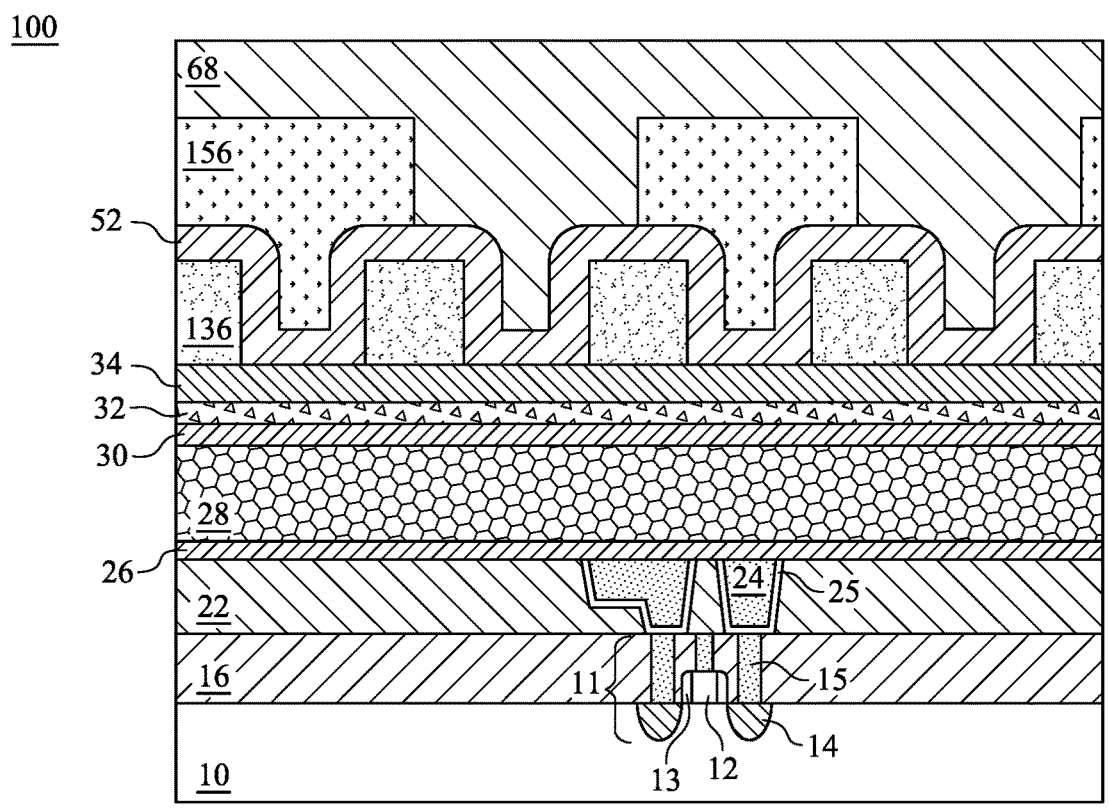

In FIGS. 14A and 14B, a reverse material 68 may be deposited in the openings 66. As such, the patterned bottom layer 156 functions as a bottom layer of a photo mask as well as a template for depositing the reverse material 68. The reverse material 68 is used to reverse the effects of a previous etching. For example, patterns may be etched at a particular spacing to due to pattern loading effects, however, the patterns may then be altered by the use of the reverse material 68. In various embodiments, the reverse material 68 comprises an inorganic material. For example, the reverse material 68 may be an inorganic oxide, such as, titanium oxide, tantalum oxide, silicon oxide, and the like. Because the bottom layer 156 is amorphous carbon deposited by CVD, the reverse material 68 need not be a low temperature oxide (i.e., an oxide deposited with a low process of temperature of about 200° C. or less). Instead, the reverse material 68 includes many more candidate materials. In some embodiments, the reverse material 68 may comprise a nitride, such as silicon nitride or silicon oxynitride, or the like. The reverse material 68 may be selected to have sufficient etch selectivity to the spacer layer 52 relative a same etch process. For example, a ratio of an etch rate of the reverse material 68 to an etch rate of the spacer layer 52 relative a same etch process is at least 0.7 in some embodiments.

The reverse material 68 may be formed using a semiconductor film deposition process, such as, CVD, PVD, ALD, or the like. In some embodiments, the reverse material 68 may be deposited at a process temperature between 50° C. and about 300° C., such as between 200° C. and 300° C. The process temperature can be a higher temperature than, for example, used in depositing a low-temp oxide, because the bottom layer 156 is CVD deposited amorphous carbon which can withstand higher temperatures than a spin on polymer. The semiconductor film deposition process may be a conformal process, which forms on sidewalls and a bottom surface of openings 66 (see FIGS. 12A and 12B). As deposition continues, portions of the reverse material 68 on opposing sidewalls of the openings 66 may merge, which fills the openings 66. As a result of the semiconductor film deposition process, a top surface of the reverse material 68 may not be planar.

Figure 15B:
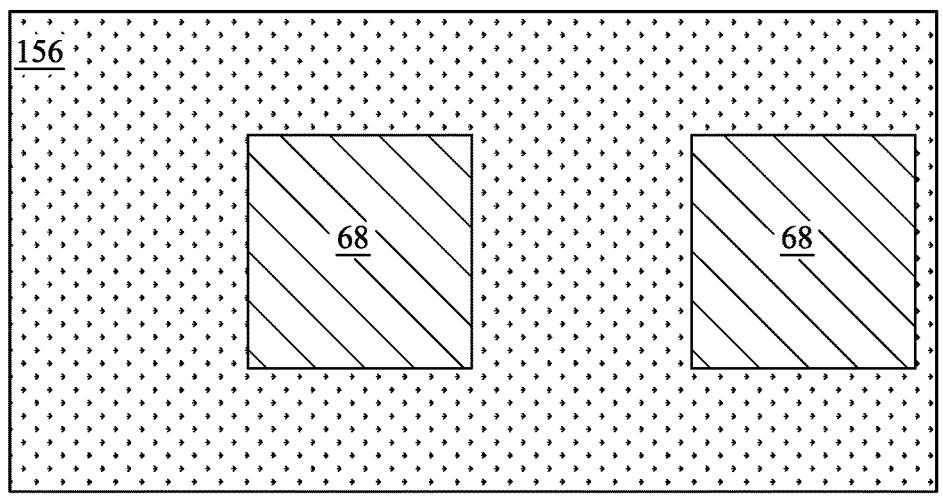
Figure 15A:
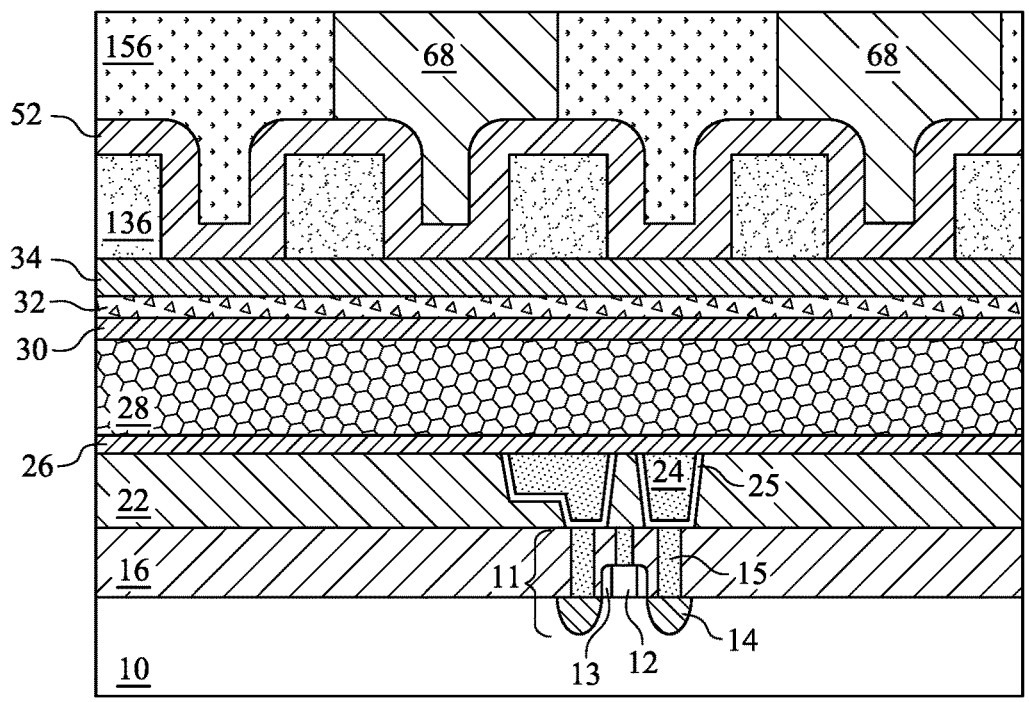

In FIGS. 15A and 15B, the reverse material 68 may next be trimmed in an etch back, planarization process, or combination thereof. A planarization process (e.g., a chemical mechanical planarization (CMP), dry etching, combinations thereof, or the like) may be performed to remove excess portions of the reverse material 68 outside of the openings 66. After the planarization process, the bottom layer 156 is exposed, and top surfaces of the reverse material 68 and the bottom layer 156 may be flat and co-planar. In some embodiments, the planarization process may also remove divots formed in the upper surface of the reverse material 68.

Figure 16B:
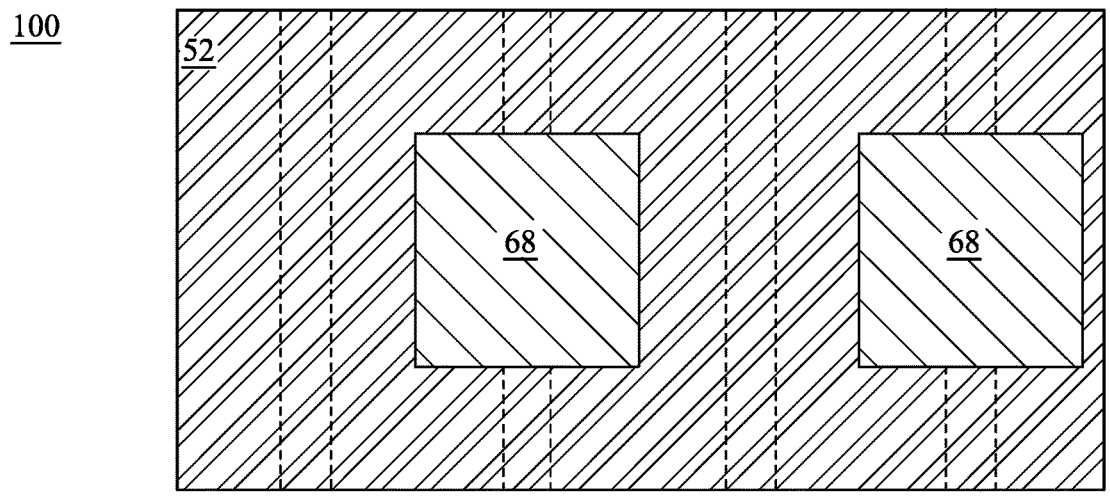
Figure 16A:
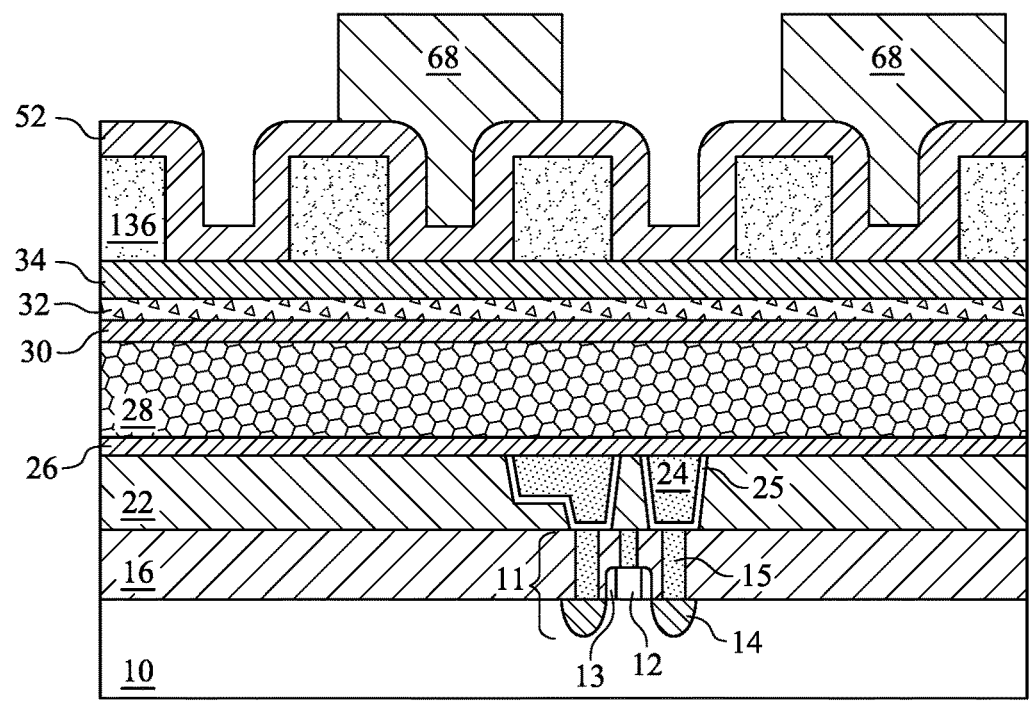

In FIGS. 16A and 16B, the bottom layer 156 is next removed using an ashing process or etching process. After the bottom layer 156 is removed, pillars of the reverse material 68 remain. The remaining reverse material 68 masks select areas of the spacer layer 52. In some embodiments, the reverse material 68 may span from a first sidewall portion of the spacer layer 52 on a first mandrel 136 to a second sidewall portion of the spacer layer 52 on a second respective mandrel 136.

Figure 17B:
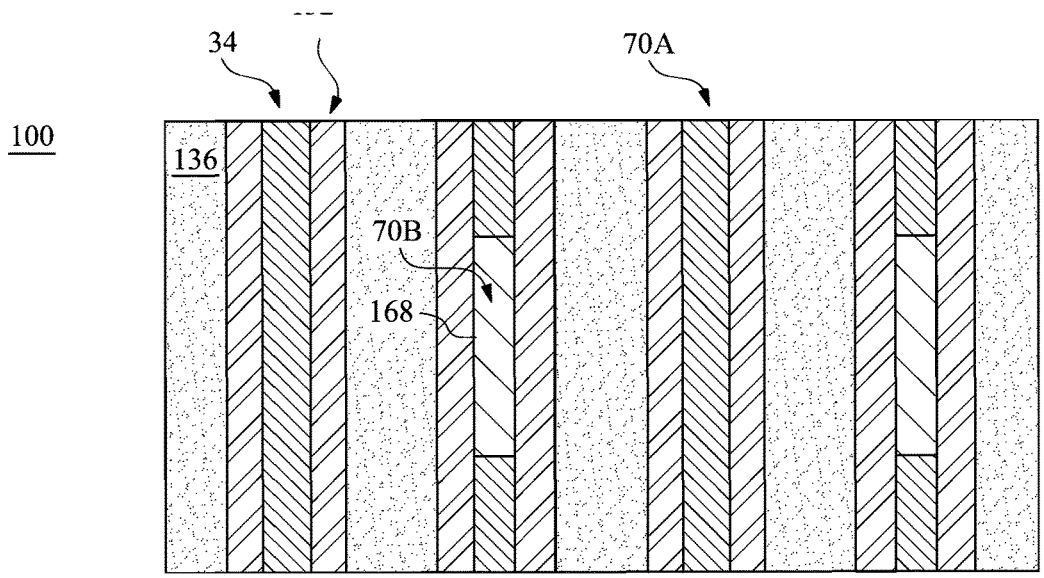
Figure 17A:
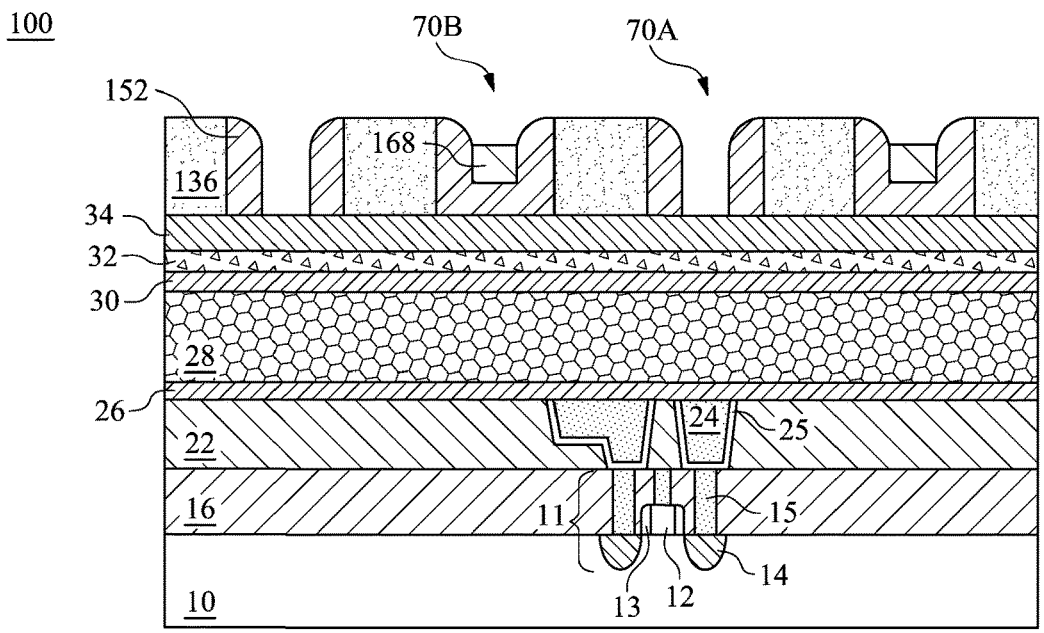

In FIGS. 17A and 17B, the reverse material 68 may then be trimmed in an etch back process in order to achieve a desired profile. In some embodiments, trimming the reverse material 68 recesses the reverse material 68 below a topmost surface of the spacer layer 52, such as, below a top surface of the mandrels 136, thereby forming the reverse material 168. Trimming the reverse material 68 may expose portions of the spacer layer 52 over the mandrels 124. In some embodiments, trimming the reverse material 68 may also reduce a width of the reverse material 68.

Trimming the reverse material 68 may include a dry etch process or a combination of dry and wet etch processes. Embodiment dry etch processes for trimming the reverse material 68 may comprise using carbon-fluoro-based etchants (e.g., $CF_4$). Other process gases may be used in combination with the carbon-fluoro-based etchants, such as, oxygen ($O_2$), nitrogen ($N_2$), argon (Ar), combinations thereof, or the like. Embodiment wet etch processes for trimming the reverse material 68 may comprise using diluted hydrofluoric acid as an etchant. A desired shape of the reverse material 168 may be achieved, for example, by controlling the concentrations and duration of the trimming process.

In some embodiments, trimming the reverse material 68 may be performed by an anisotropic etch which also etches the spacer layer 52 to remove the horizontal portions of the spacer layer 52 which are exposed from the reverse material 68. As indicated in FIGS. 17A and 17B, the horizontal portions of the spacer layer 52 which are under the reverse material 68 are not removed. This process results in producing the self-aligned spacer mask 152 which includes stand-alone vertical portions of the spacer layer 52 and portions of the spacer layer 52 which span between mandrels of the patterned mandrel layer 136. The openings 70A expose portions of the mask layer 34. The openings 70B indicate a depression on the reverse material 168.

Figure 18B:
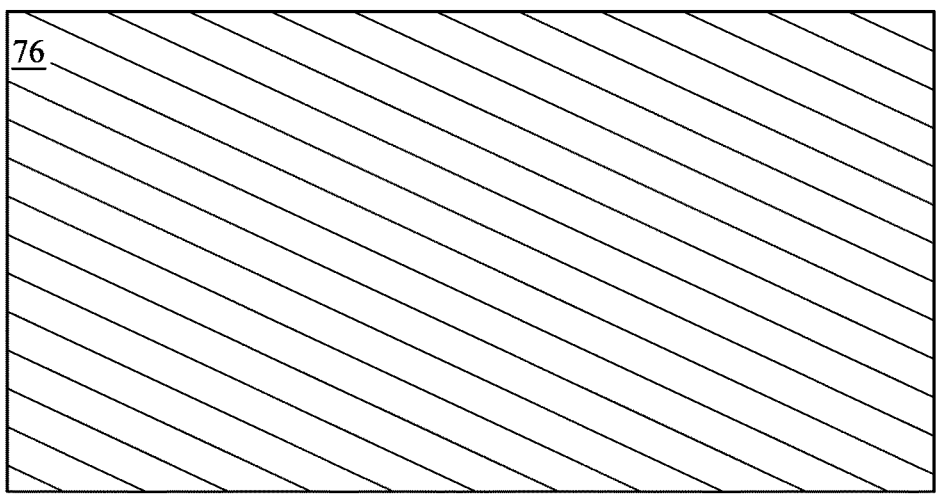
Figure 18A:
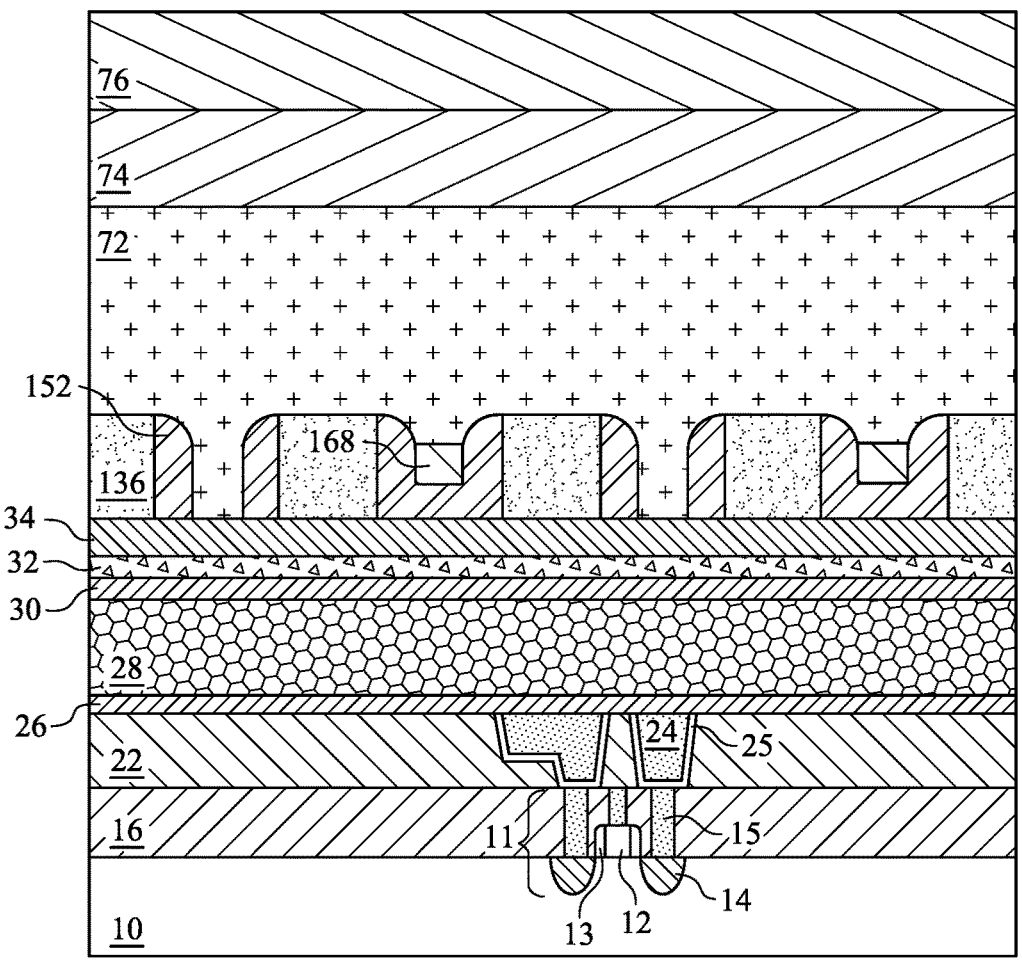

In FIGS. 18A and 18B, select mandrels in the patterned mandrel layer 136 may be removed to create further openings between the vertical spacers of spacer mask 152. A tri-layer or bi-layer photoetching process may be used to remove the select mandrels 136. The bottom layer 72 may be deposited over the spacer mask 152, the patterned mandrel layer 136, and reverse material 168. In some embodiments, the bottom layer 72 may be formed using processes and materials similar to those used to form the bottom layer 38, while in other embodiments, the bottom layer 72 may be formed using processes and materials similar to those used to form the bottom layer 56. In some embodiments, the middle layer 74 (if used) may be deposited over the bottom layer 72 using materials and processes similar to those used to form the middle layer 40, while in other embodiments, the middle layer 74 may be formed using processes and materials similar to those used to form the middle layer 58. In some embodiments, the upper layer 76 may be deposited over the middle layer 74 (if used) or bottom layer 72 using materials and processes similar to those used to form the upper layer 42, while in other embodiments, the upper layer 76 may be formed using processes and materials similar to those used to form the upper layer 60.

Figure 19B:
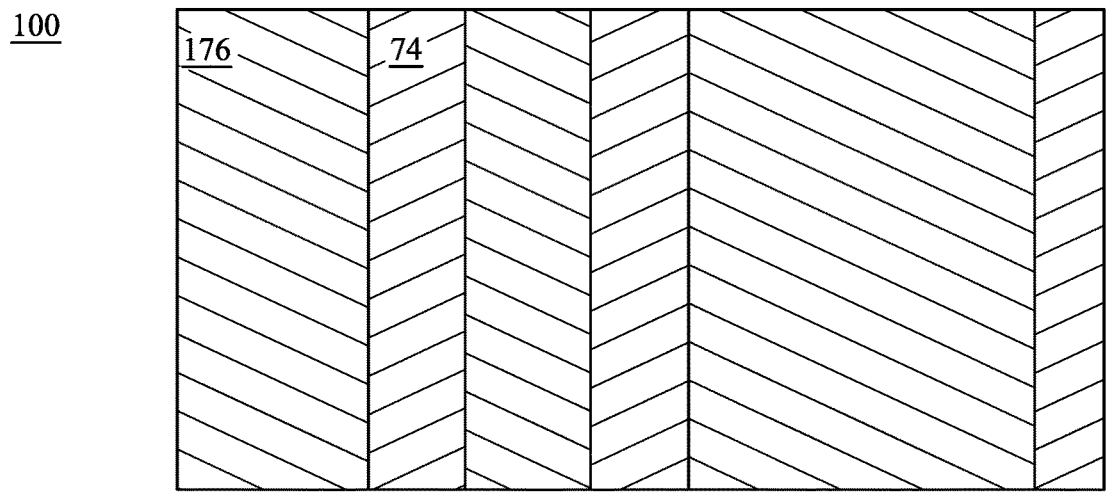
Figure 19A:
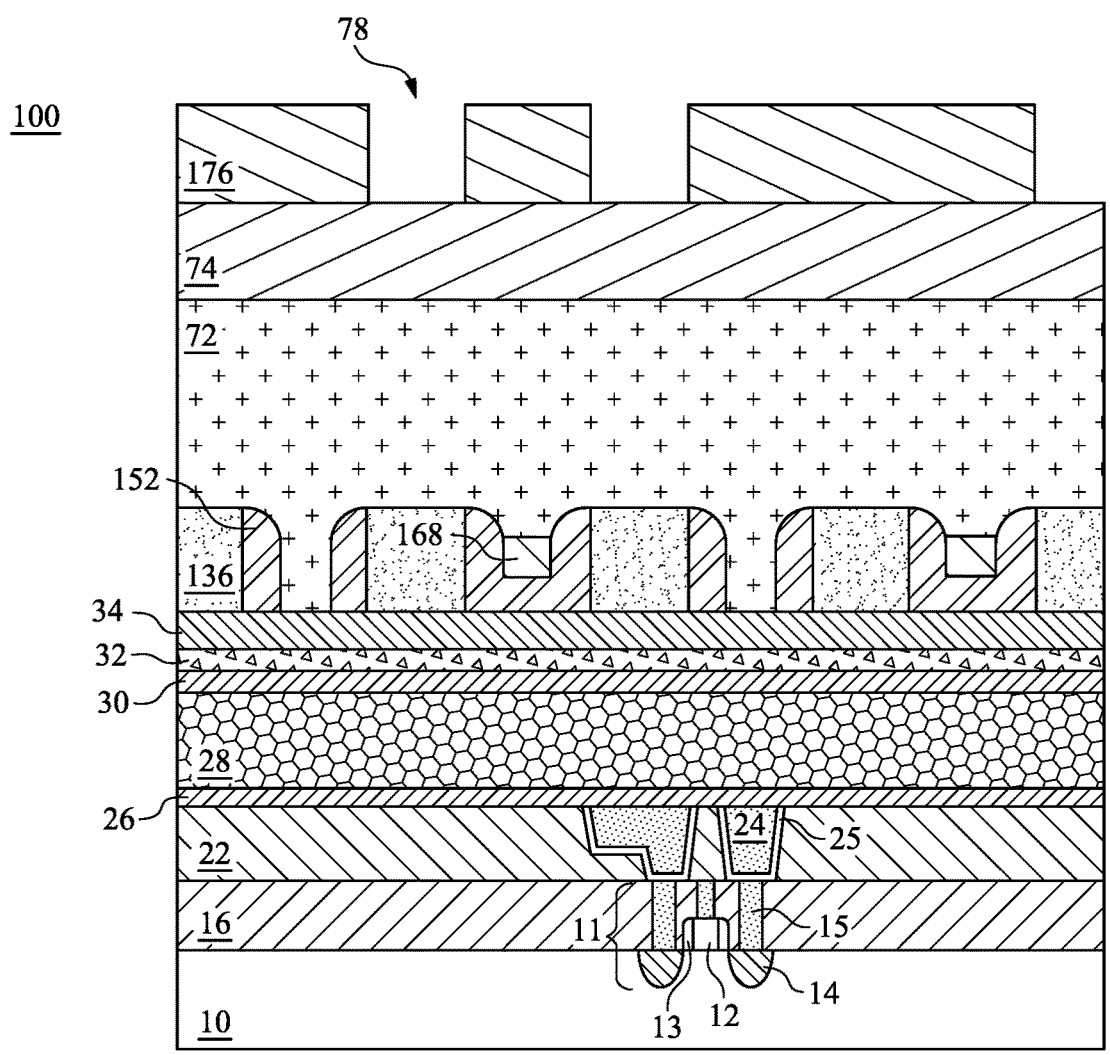

In FIGS. 19A and 19B, after the upper layer 76 is formed, the upper layer 76 is patterned to form patterned upper later 176 using an acceptable photolithography technique, for example, by exposing the upper layer 76 to light through a light mask and developing the upper layer 76 to remove portions thereof. The patterned upper layer 176 includes openings 78 therein.

Figure 20B:
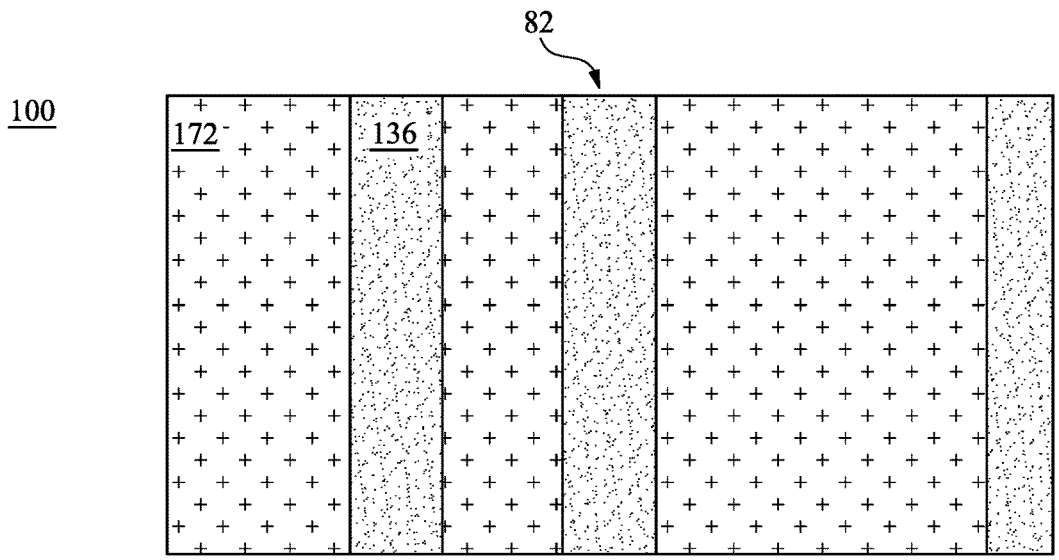
Figure 20A:
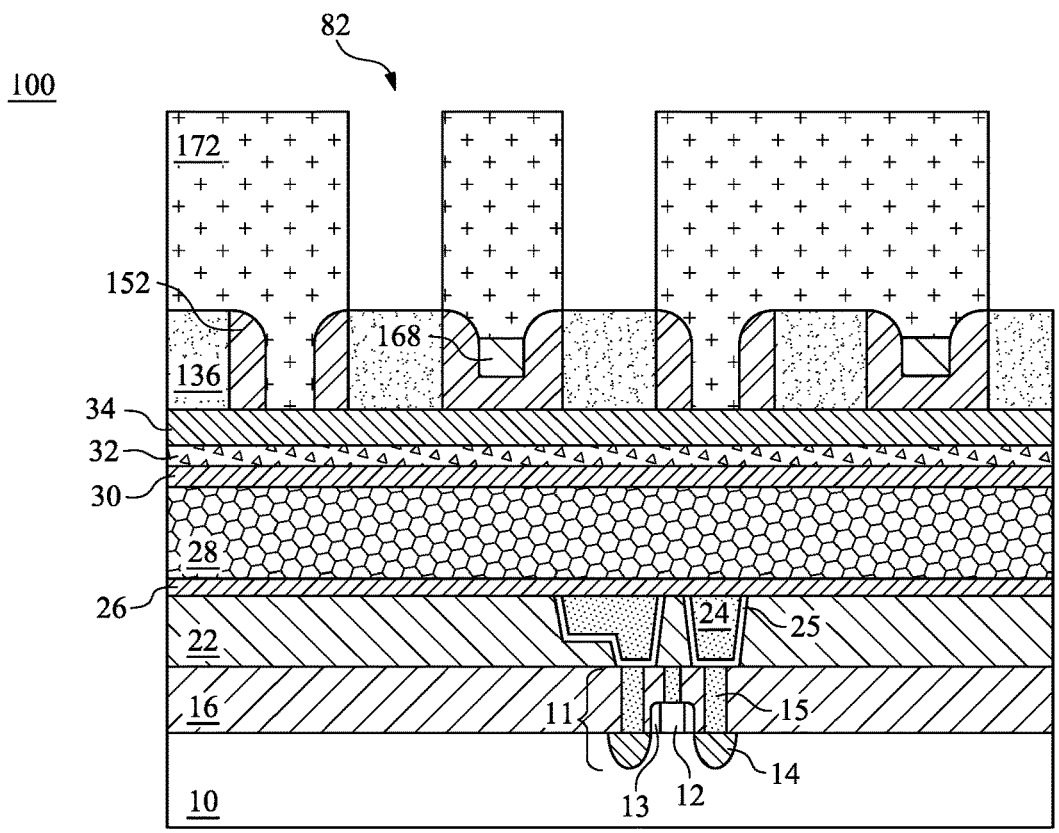

In FIGS. 20A and 20B, the middle layer 74 (if used) is etched to form a patterned middle layer 174, using processes such as those described above with respect to the middle layer 40 or the middle layer 58. The bottom layer 72 is then etched to form patterned bottom layer 172. Bottom layer 72 is etched using the patterned middle layer 174 (if used) as an etching mask or the patterned upper layer 176 as an etching mask, so that the pattern of middle layer 174 (or upper layer 176) is transferred to bottom layer 72 to create a patterned bottom layer 172. The bottom layer 138 has openings 82. Openings 82 may be tapered or may have vertical sidewalls, within process variations. Any suitable etching technique may be used, such as a wet or dry etch using an etchant which is selective to the material of bottom layer 72. For example, in some embodiments the etchant may be $O_2$ based or $N_2/H_2$ based etchant gas used in an etching chamber with other process gasses.

Figure 21B:
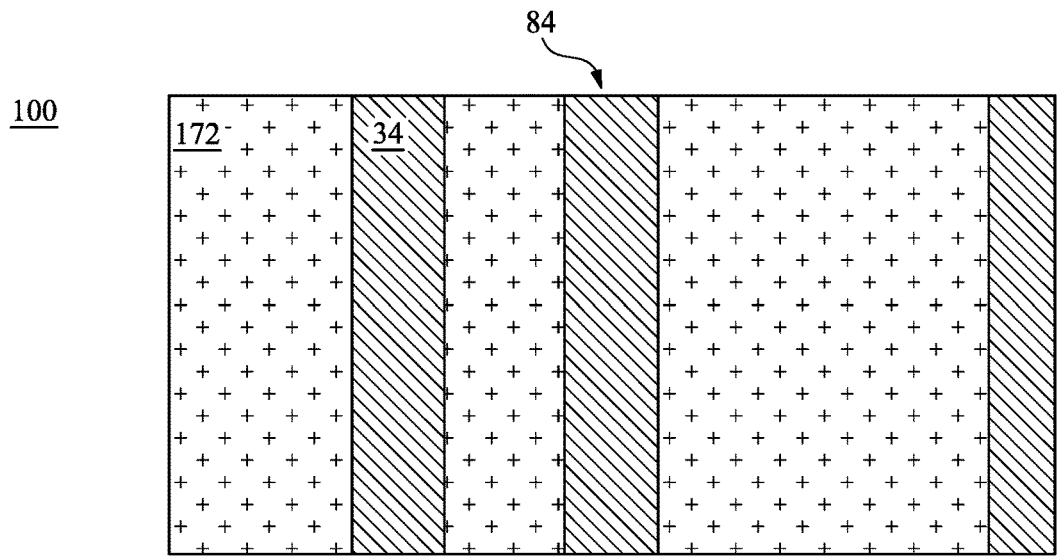
Figure 21A:
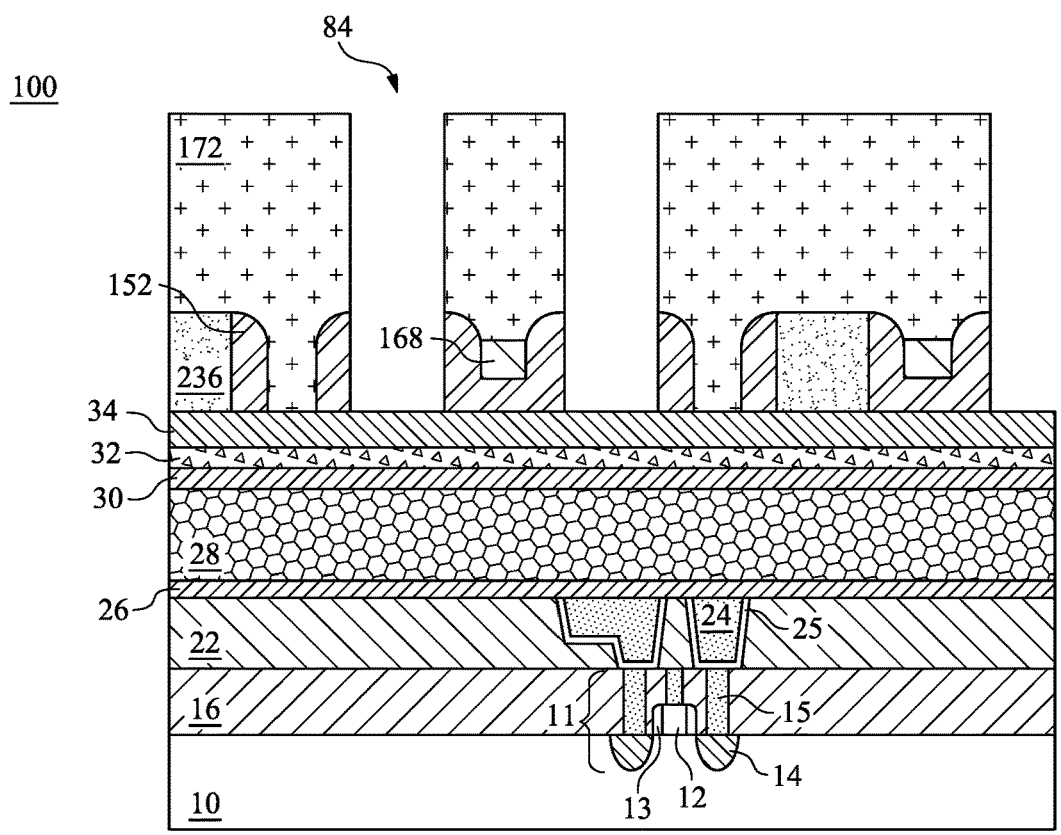

In FIGS. 21A and 21B, the patterned mandrel layer 136 is selectively etched in an etching step to remove the exposed mandrels, thereby forming openings 84, in the patterned mandrel layer 236. In accordance with some embodiments, the etching is performed using a wet etch or a dry etch. The respective etchant may include an HF solution or a mixture of $NF_3$ and $NH_3$ gases, and the appropriate etchant depends from the material of the patterned mandrel layer 136.

Figure 22B:
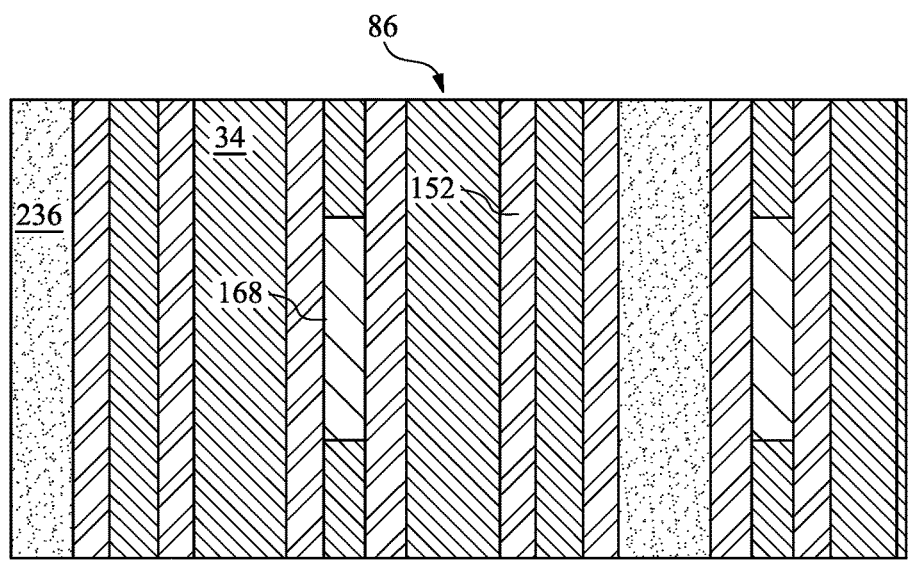
Figure 22A:
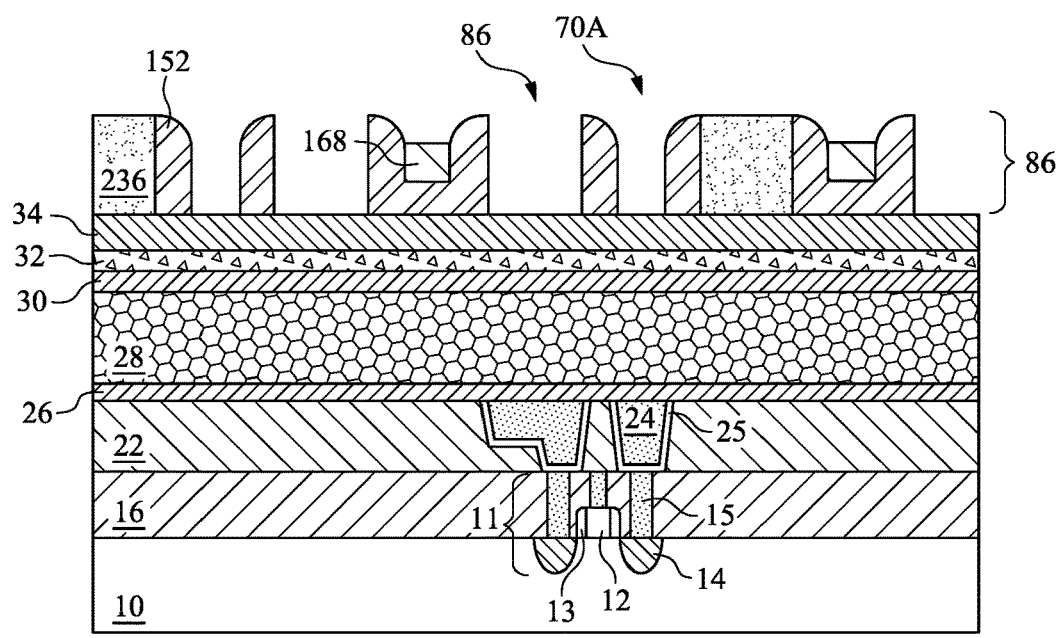

In FIGS. 22A and 22B, the bottom layer 172 is removed, for example by a suitable ashing or etching process. Accordingly, multiple types/widths of openings may be formed in what was originally mandrel layer 36. The structures making up the patterned mask overlying on the mask layer 34 may include portions of the patterned mandrel layer 236, the spacer mask 152, and the reverse material 168. Together, these are labelled as combination mask 86. The reverse material 168 in particular covers portions of the spacer mask 152 which was done as described above with respect to FIGS. 17A and 17B to protect those horizontal portions of the spacer mask 152 which were not meant to be removed.

Figure 23B:
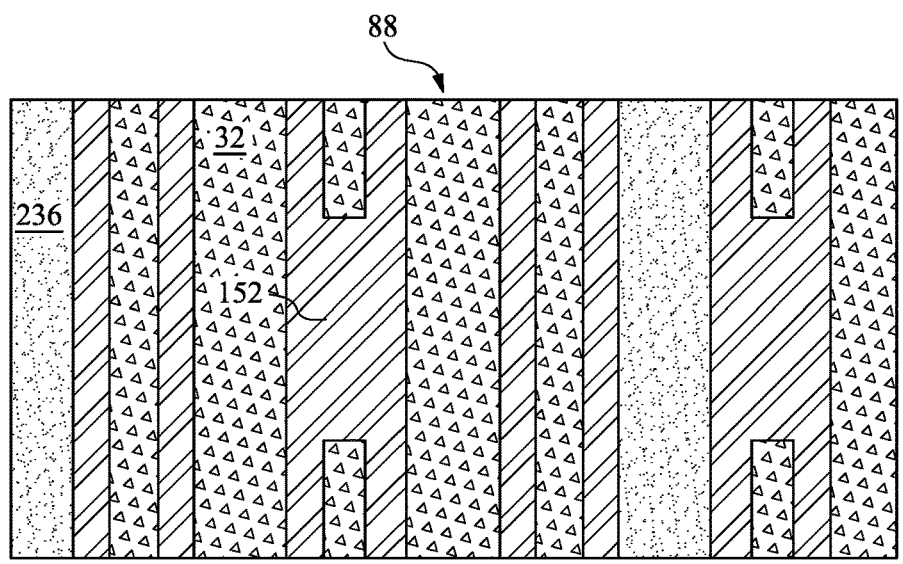
Figure 23A:
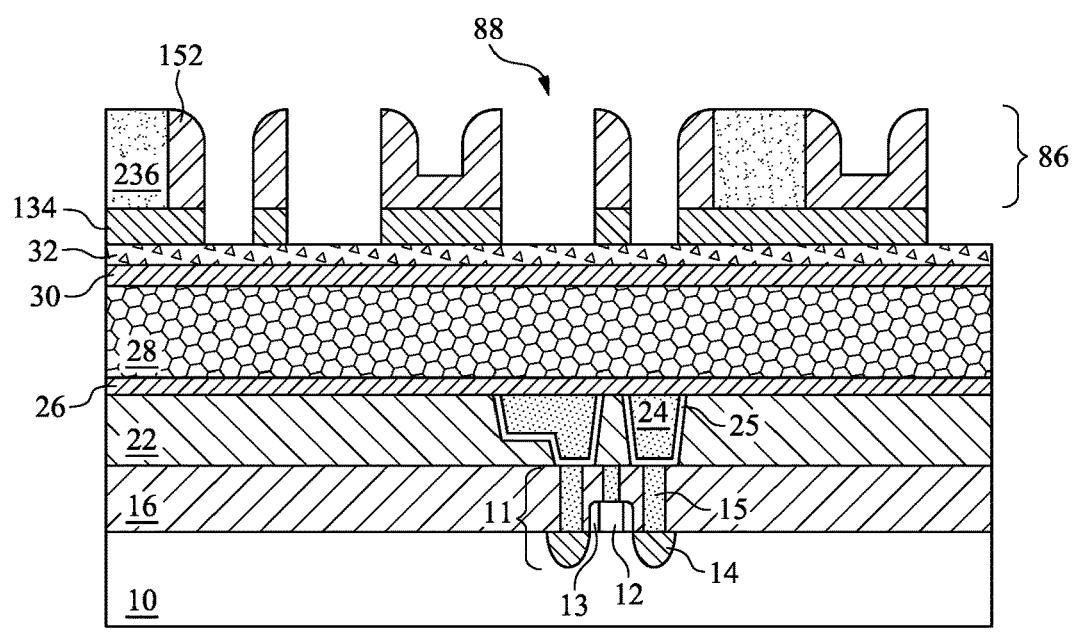

In FIGS. 23A and 23B, the mask layer 34 is etched using the combination mask 86 as an etching mask, so that the pattern of the combination mask 86 is transferred to mask layer 34 to create a patterned mask layer 134, which may also be referred to as mask layer 134. The patterned mask layer 134 has openings 88 which have been extended from openings 70A and openings 84. The etching of patterned mask layer 134 may be performed by any suitable technique, such as by a wet or dry etch selective to the material of mask 34. In some embodiments, the etching of patterned mask layer 134 may consume portions or all of the combination mask 86, such as the reverse material 168 from the combination mask 86. For example, as illustrated in FIGS. 23A and 23B, the reverse material 168 is removed at the same time as etching the mask layer 34, as the reverse material 168 and the mask layer 34 may have a similar etch selectivity. The patterned mandrel layer 236 is not illustrated as being removed as it has high etch selectivity to the mask layer 34. The spacer mask 152 may be removed or may remain in whole or in part, depending on the etch selectivity of the spacer mask 152 to the mask layer 34. In embodiments where the spacer mask 152 is removed at the same time as etching the mask layer 34, the reverse material 168 serves to protect the portion of the mask layer 34 under the reverse material 168 from being etched. For example, the spacer mask 152 directly under the reverse material 168 could otherwise be incidentally etched while etching the mask layer 34. The mask layer 32 serves as an etch stop for etching the mask layer 34.

Figure 24B:
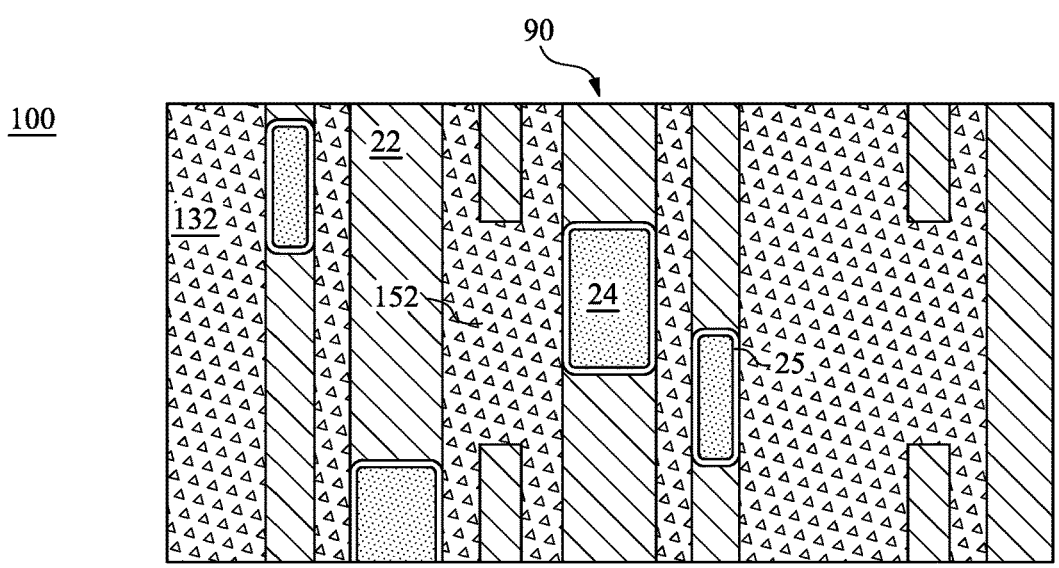
Figure 24A:
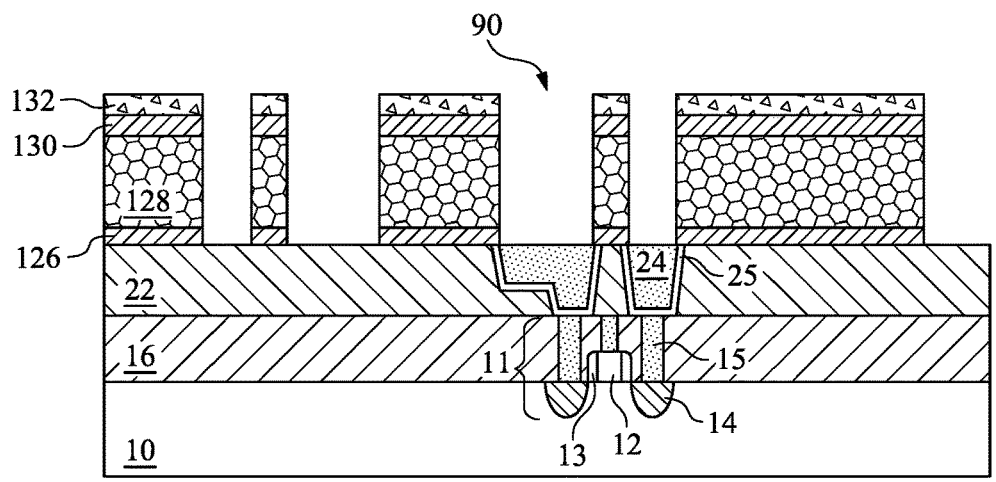

In FIGS. 24A and 24B, following the etching of the patterned mask layer 134, patterned mask layer 134 is used to pattern mask 32 to form patterned mask layer 132 by using the patterned mask layer 134 as an etching mask, so that the pattern of mask layer 134 is transferred to mask 32. The etchant and etching technique used can be selective to the material of patterned mask layer 132.

The patterned mask layer 132 is used as an etching mask to progressively transfer the pattern of patterned mask layer 132 to the underlying mask 30 to form the patterned mask 130, target layer 28 to form the patterned target layer 128, and ESL 26 to form the patterned etch stop layer 126, by etching each layer in turn, using one or more of the previous layers as a mask. In some embodiments, prior to using patterned mask layer 132 as a mask in etching the underlying layers, the remaining portions of patterned mask layer 134 may be removed by a separate process. In some embodiments, the remaining portions of patterned mask layer 134 may be removed simultaneously with etching mask 30.

The patterned target layer 128 and patterned etch stop layer 126 may be etched using a suitable etching technique such as a wet or dry etch using an appropriate etchant which is selective to the respective materials to be etched. In particular, patterned target layer 128 may be etched using a plasma or RIE anisotropic etch using ESL 26 as an etch stop so that the widths of the resulting trenches are relatively uniform within process variations. Then, in a subsequent process, ESL 26 may be etched using the patterned target layer 128, patterned mask 130, or patterned mask layer 132 as a mask to expose the conductive features 24. The openings 90 formed in the patterned target layer 128 may include trenches and/or vias. For example, vias may reach the exposed conductive features 24, while trenches may be formed to have a bottom which is between the topmost surface of the patterned target layer 128 and the bottommost surface of the patterned target layer 128.

Figure 25B:
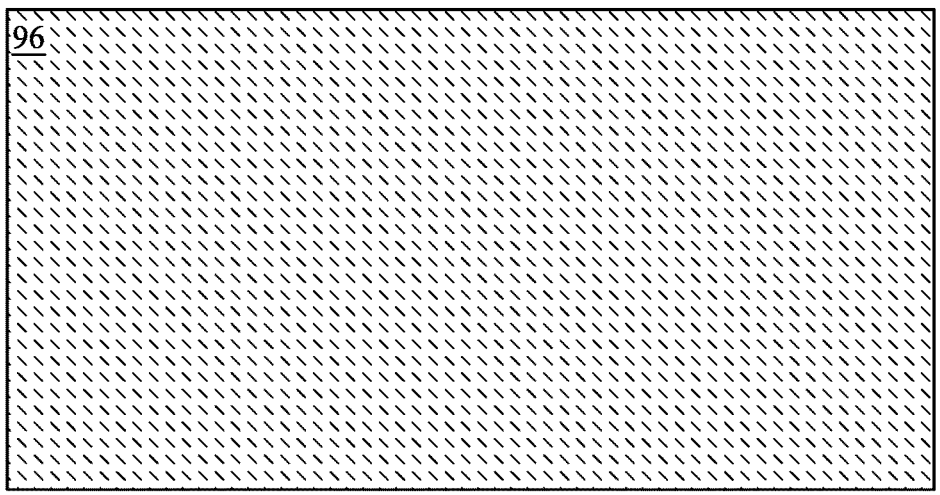
Figure 25A:
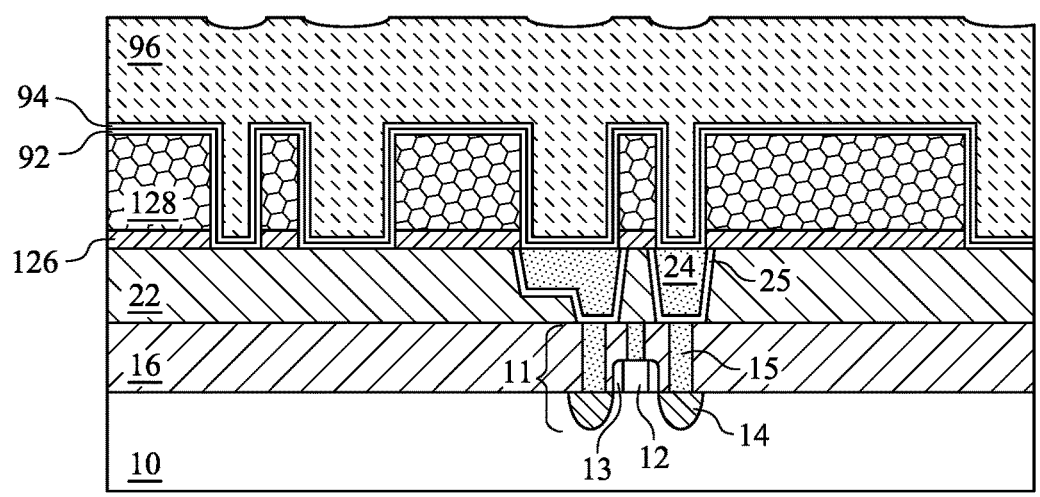

In FIGS. 25A and 25B, a conductive fill 96 is deposited in the openings 90 of the patterned target layer 128. Prior to depositing the conductive fill 96, a liner 92, which may include diffusion barrier layers, adhesion layers, and/or the like may be deposited in the openings 90. The liner 92 may be formed of titanium, titanium nitride, tantalum, tantalum nitride, or other alternatives. A seed layer 94 may be formed over the liner 92 and may include a conductive material such as copper, a copper alloy, silver, gold, tungsten, aluminum, or the like. In accordance with some embodiments, the formation of the liner 92 includes performing an ALD or CVD deposition, and the formation of the seed layer 94 may include performing a PVD, ALD, or CVD deposition. The conductive fill 96 may be deposited in the remainder of the openings 90, and may include any suitable conductive material, such as copper, a copper alloy, silver, gold, tungsten, aluminum, cobalt, or the like. The conductive fill 96 may be deposited by any suitable process, such as by electro-plating, electro-less plating, CVD, sputtering, or the like.

Figure 26B:
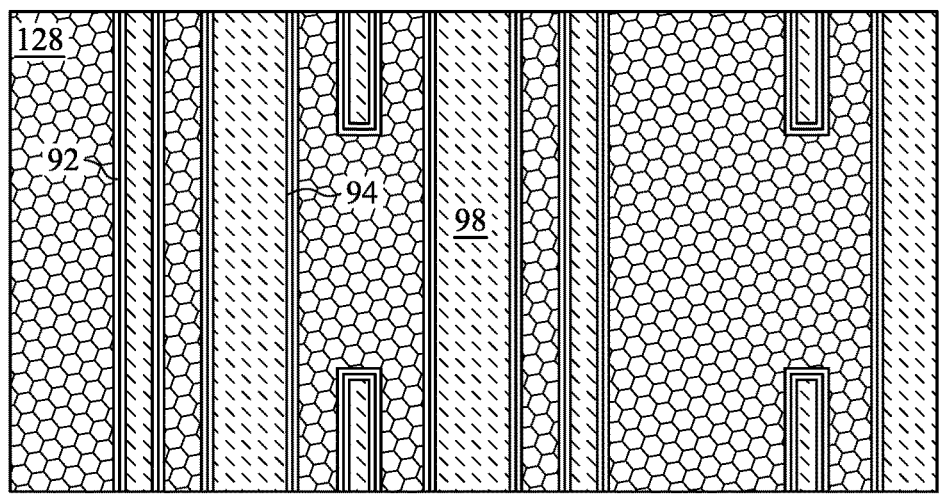
Figure 26A:
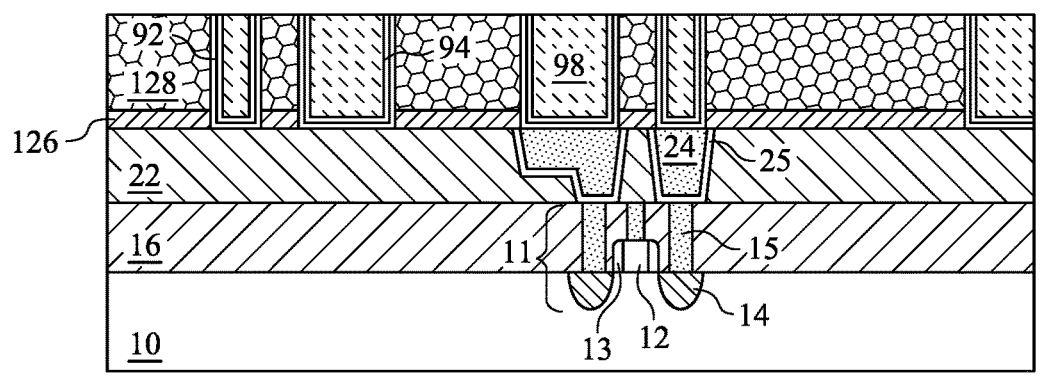

In FIGS. 26A and 26B, a planarization such as Chemical Mechanical Planarization (CMP) is performed to level the surface of conductive fill 96, and to remove excess conductive materials (e.g., from the liner 92 and/or seed layer 94) from the top surface of patterned target layer 128. In some embodiments, the liner 92, seed layer 94, and conductive fill 96 may be deposited while the patterned mask 130 is still in place. In such embodiments, the patterned mask 130 may be removed in the planarization or etched after the planarization. The planarization process may separate the conductive fill 96 into individual contacts 98.

Figure 27B:
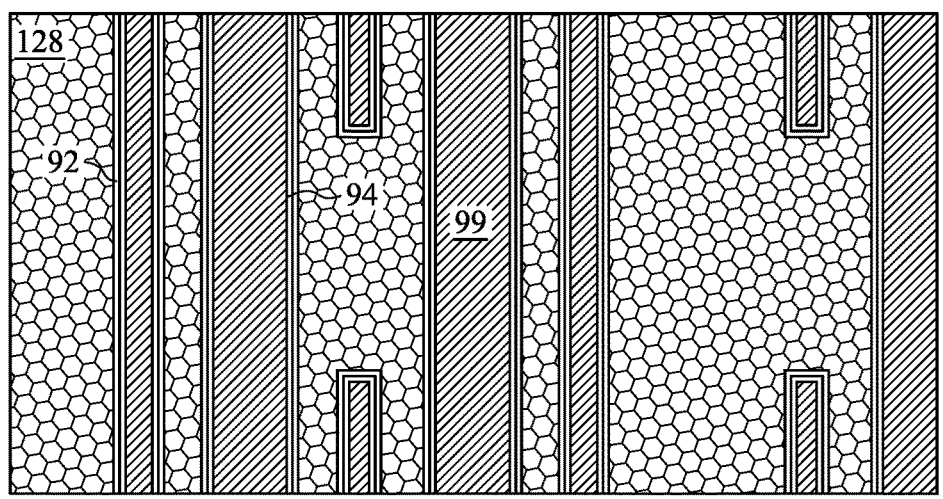
Figure 27A:
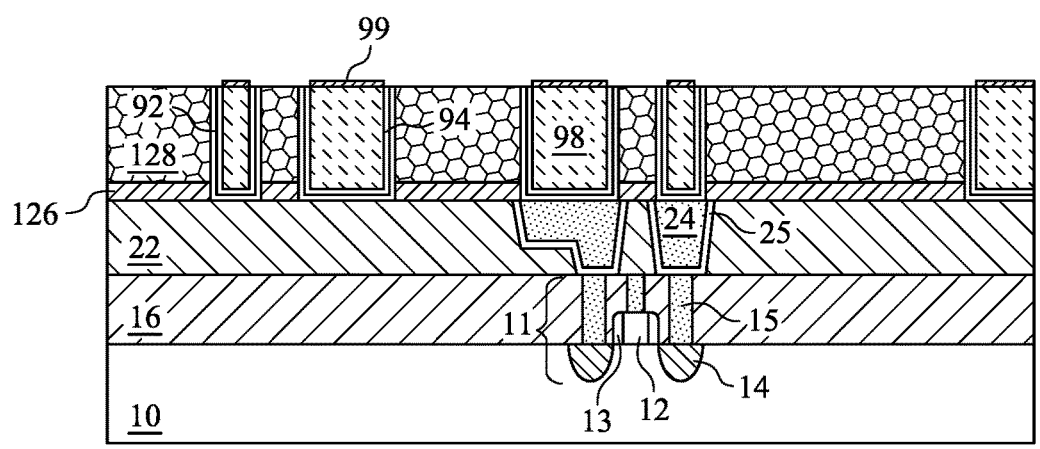

In FIGS. 27A and 27B, after the planarization process, a capping layer 99 is formed over the contacts 98. The capping layer 99 may be deposited over the contacts 98, the liner 92, seed layer 94, and the patterned target layer 128. The capping layer 99 may comprise cobalt, ruthenium, the like, or a combination thereof. The capping layer 99 provides protection from oxidation of underlying portions of the contacts 98, such as the conductive fill 96. The deposition of the capping layer 99 may use the conductive fill 96 as a seed layer for some deposition processes. After depositing the material for the capping layer 99, in some embodiments, excess portions may optionally be removed with any suitable method, such as using a suitable lithography process. For example, a photoresist may be formed over the material of the capping layer 99 and patterned to expose portions of the material of the capping layer 99 that are not directly over the contacts 98. The exposed portions may then be removed by etching or any suitable method, and the photoresist may then be removed by any suitable method. In some embodiments, the capping layer 99 is selectively deposited over the conductive fill 96 or over one or more of the conductive fill 96, seed layer 94, or liner 92, for example by using the conductive fill 96, seed layer 94, or liner 92 as a seed layer for some deposition processes. In some embodiments, excess portions of the capping layer 99 may be removed by cleaning processes that can remove portions of the capping layer 99 deposited on the patterned target layer 128 but not well bonded thereto. The capping layer 99 may be deposited using CVD, PECVD, PVD, ALD, PEALD, ECP, such as high voltage ECP, or electro-less plating, or the like. The capping layer 99 may have a thickness of between about 10 Å and about 50 Å.

In subsequent steps, an additional etch stop layer (not shown) may be formed, and more low-k dielectric layers, metal lines, and vias (not shown) may be formed over the additional etch stop layer. The process steps and resulting structures may be similar to what are shown in FIGS. 1A and 1B through 27A and 27B.

Embodiments achieve several advantages. Utilizing the amorphous carbon chemical vapor deposited bottom layer allows overlying layers to be deposited to produce higher quality films by allowing for increased deposition process temperatures than would ordinarily be achievable. Topography issues are resolved and the overlying layers can be deposited in such a manner as to reduce potential defects or photomask alignment errors. Moreover, embodiments allow for the use of a two-layer photomask structure or a three-layer photomask structure. In the case of a three-layer photomask structure, the middle layer can be deposited by a CVD process because of the high temperature tolerances and flexibility afforded by the embodiment bottom layer. In the case of a two-layer photomask, the upper layer can be a metal oxide photoresist. The bottom layer can then be used as a template for depositing a reverse material on a spacer layer to control patterning design.

One embodiment is a method including forming a spacer layer over a patterned mandrel layer. The method also includes forming an insulating layer over the spacer layer, the insulating layer including amorphous carbon. The method also includes patterning the insulating layer to form an opening in the insulating layer, the opening exposing a portion of the spacer layer disposed between two mandrels of the patterned mandrel layer. The method also includes depositing a reverse material in the opening. The method also includes removing the insulating layer, the reverse material, and exposed horizontal portion of the spacer layer, where a portion of the reverse material remains covering part of the spacer layer between the two mandrels of the patterned mandrel layer. The method also includes removing one or more mandrels from the patterned mandrel layer. The method also includes etching a target layer based on a pattern determined by a combination of the patterned mandrel layer, the spacer layer, and the reverse material. In an embodiment, depositing the reverse material includes heating the insulating layer to a temperature between 200° C. and 300° C. In an embodiment, forming the insulating layer includes using a chemical vapor deposition process with a hydrocarbon gas as a precursor. In an embodiment, the insulating layer has an oxygen content of less than 5%. In an embodiment, etching the target layer forms second openings therein, the second openings exposing a conductive feature underlying the target layer, further including: depositing a liner layer; depositing a conductive fill; planarizing the conductive fill to separate the conductive fill into first contacts; and capping the first contacts with a metal capping layer. In an embodiment, the metal capping layer includes cobalt. In an embodiment, the method further includes, depositing a first patterning layer over the insulating layer, the first patterning layer including a photoresist and developing the photoresist to form a first pattern in the first patterning layer; and transferring the first pattern to the insulating layer in the patterning of the insulating layer. In an embodiment, the method further includes: depositing a second patterning layer over the insulating layer, the second patterning layer interposed between the first patterning layer and the insulating layer, the second patterning layer including an inorganic material. In an embodiment, the photoresist of the first patterning layer includes a metal oxide.

Another embodiment is a method including depositing a conformal spacer layer over a set of mandrels. The method also includes depositing a bottom layer of a photomask over the spacer layer, the bottom layer of the photomask including carbon, hydrogen, and oxygen, bottom layer having less than 5% oxygen. The method also includes depositing an upper layer of the photomask over the bottom layer, the upper layer including a light-sensitive photoresist. The method also includes developing the upper layer to form a first pattern therein. The method also includes transferring the first pattern to the bottom layer, the first pattern exposing first portions of the spacer layer. The method also includes depositing a protective layer over the bottom layer and over the first portions of the spacer layer. The method also includes removing the bottom layer to expose the spacer layer except for the first portions of the spacer layer underlying the protective layer. The method also includes etching the spacer layer to remove horizontal portions of the spacer layer, except for the first portions of the spacer layer underlying the protective layer. The method also includes etching the set of mandrels to remove one or more mandrels. The method also includes etching a target layer underlying the spacer layer to form a second pattern therein, the second pattern based on using remaining spacer layer, including the first portions of the spacer layer, as an etch mask. In an embodiment, depositing the bottom layer includes: providing a plasma gas to a deposition chamber; providing a hydrocarbon precursor gas to the deposition chamber; and controlling a reaction between the plasma gas and the hydrocarbon precursor gas to deposit the bottom layer. In an embodiment, the protective layer is deposited at a process temperature between 200° C. and 300° C. In an embodiment, the upper layer of the photomask includes a metal oxide photoresist. In an embodiment, the method further includes: depositing a middle layer of the photomask over the bottom layer prior to depositing the upper layer. In an embodiment, the middle layer is deposited by a chemical vapor deposition process.

Another embodiment is a method including depositing a bottom mask layer over a target layer using a hydrocarbon precursor. The method also includes depositing a top mask layer over the bottom mask layer. The method also includes patterning the top mask layer by a photolithography process to form a patterned top mask. The method also includes etching the bottom mask layer based on the patterned top mask to form a patterned bottom mask, the patterned bottom mask including first openings. The method also includes depositing a reverse material in the first openings. The method also includes removing the bottom mask layer and thinning the reverse material, a first portion of the reverse material disposed on a spacer layer between two mandrels of a mandrel layer. The method also includes etching the spacer layer to remove horizontal portions of the spacer layer, except horizontal portions of the spacer layer underneath the first portion of the reverse material. The method also includes transferring a pattern of remaining spacer layer, remaining mandrel layer, and remaining reverse material to a mask layer. The method also includes etching a target layer based on a pattern of the mask layer. In an embodiment, the method further includes depositing a middle mask layer interposed between the top mask layer and the bottom mask layer. In an embodiment, the reverse material extends over an upper surface of the bottom mask layer, where depositing the reverse material includes heating the bottom mask layer to a temperature between 200° C. and 300° C. In an embodiment, the hydrocarbon precursor interacts with argon ions to form the bottom mask layer by a chemical vapor deposition process, the bottom mask layer including amorphous carbon. In an embodiment, the top mask layer includes a metal oxide photo resist.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a spacer layer over a patterned mandrel layer;
   forming an insulating layer over the spacer layer, the insulating layer comprising amorphous carbon;
   patterning the insulating layer to form an opening in the insulating layer, the opening exposing a portion of the spacer layer disposed between two mandrels of the patterned mandrel layer;
   depositing a reverse material in the opening;
   removing the insulating layer, the reverse material, and an exposed horizontal portion of the spacer layer, wherein a portion of the reverse material remains covering part of the spacer layer between the two mandrels of the patterned mandrel layer;
   removing one or more mandrels from the patterned mandrel layer;
   etching a target layer based on a pattern determined by a combination of the patterned mandrel layer, the spacer layer, and the reverse material, wherein etching the target layer forms second openings therein, the second openings exposing a conductive feature underlying the target layer;
   depositing a liner layer;
   depositing a conductive fill;
   planarizing the conductive fill to separate the conductive fill into first contacts; and
   capping the first contacts with a metal capping layer.

2. The method of claim 1, wherein depositing the reverse material comprises heating the insulating layer to a temperature between 200° C. and 300° C.

3. The method of claim 1, wherein forming the insulating layer comprises using a chemical vapor deposition process with a hydrocarbon gas as a precursor.

4. The method of claim 1, wherein the insulating layer has an oxygen content of less than 5%.

5. The method of claim 1, wherein at least one mandrel remains when etching the target layer.

6. The method of claim 1, wherein the metal capping layer comprises cobalt.

7. The method of claim 1, further comprising: depositing a first patterning layer over the insulating layer, the first patterning layer comprising a photoresist and developing the photoresist to form a first pattern in the first patterning layer; and
   transferring the first pattern to the insulating layer in the patterning of the insulating layer.

8. The method of claim 7, further comprising: depositing a second patterning layer over the insulating layer, the second patterning layer interposed between the first patterning layer and the insulating layer, the second patterning layer comprising an inorganic material.

9. The method of claim 7, wherein the photoresist of the first patterning layer comprises a metal oxide.

10. A method comprising:
depositing a conformal spacer layer over a set of mandrels;
depositing a bottom layer of a photomask over the spacer layer, the bottom layer of the photomask comprising carbon, hydrogen, and oxygen, the bottom layer having less than 5% oxygen;
depositing an upper layer of the photomask over the bottom layer, the upper layer comprising a light-sensitive photoresist;
developing the upper layer to form a first pattern therein;
transferring the first pattern to the bottom layer, the first pattern exposing first portions of the spacer layer;
depositing a protective layer over the bottom layer and over the first portions of the spacer layer;
removing the bottom layer to expose the spacer layer except for the first portions of the spacer layer underlying the protective layer;
etching the spacer layer to remove horizontal portions of the spacer layer, except for the first portions of the spacer layer underlying the protective layer;
etching one or more mandrels in the set of mandrels to remove one or more mandrels, wherein at least a first mandrel in the set of mandrels remains after etching the one or more mandrels; and
after etching one or more mandrels, etching a target layer underlying the spacer layer to form a second pattern therein, the second pattern based on using the first mandrel and remaining spacer layer, including the first portions of the spacer layer, as an etch mask.

11. The method of claim 10, wherein depositing the bottom layer comprises:
providing a plasma gas to a deposition chamber;
providing a hydrocarbon precursor gas to the deposition chamber; and
controlling a reaction between the plasma gas and the hydrocarbon precursor gas to deposit the bottom layer.

12. The method of claim 10, wherein the protective layer is deposited at a process temperature between 200° C. and 300° C.

13. The method of claim 10, wherein the upper layer of the photomask comprises a metal oxide photoresist.

14. The method of claim 10, further comprising:
depositing a middle layer of the photomask over the bottom layer prior to depositing the upper layer.

15. The method of claim 14, wherein the middle layer is deposited by a chemical vapor deposition (CVD) process.

16. A method comprising:
depositing a bottom mask layer over a target layer using a hydrocarbon precursor;
depositing a top mask layer over the bottom mask layer;
patterning the top mask layer by a photolithography process to form a patterned top mask;
etching the bottom mask layer based on the patterned top mask to form a patterned bottom mask, the patterned bottom mask including first openings;
depositing a reverse material in the first openings;
removing the bottom mask layer and thinning the reverse material, a first portion of the reverse material disposed on a spacer layer between two mandrels of a mandrel layer;
etching the spacer layer to remove horizontal portions of the spacer layer, except the horizontal portions of the spacer layer underneath the first portion of the reverse material;
after etching the spacer layer, transferring a pattern of remaining spacer layer, remaining mandrel layer, and remaining reverse material to a mask layer; and
etching the target layer based on a pattern of the mask layer.

17. The method of claim 16, further comprising depositing a middle mask layer interposed between the top mask layer and the bottom mask layer.

18. The method of claim 16, wherein the reverse material extends over an upper surface of the bottom mask layer, wherein depositing the reverse material comprises heating the bottom mask layer to a temperature between 200° C. and 300° C.

19. The method of claim 16, wherein the hydrocarbon precursor interacts with argon ions to form the bottom mask layer by a chemical vapor deposition process, the bottom mask layer comprising amorphous carbon.

20. The method of claim 16, wherein the top mask layer comprises a metal oxide photoresist.

* * * * *